(12) United States Patent
George et al.

(10) Patent No.: US 9,952,281 B2
(45) Date of Patent: Apr. 24, 2018

(54) CLOCK JITTER AND POWER SUPPLY NOISE ANALYSIS

(71) Applicant: NVIDIA Corporation, Santa Clara, CA (US)

(72) Inventors: Varghese George, Walnut Creek, CA (US); Rubil Ahmadi, Sunnyvale, CA (US); Jesse Guss, Menlo Park, CA (US)

(73) Assignee: NVIDIA Corporation, Santa Clara, CA (US)

( * ) Notice: Subject to any disclaimer, the term of this patent is extended or adjusted under 35 U.S.C. 154(b) by 1135 days.

(21) Appl. No.: 13/935,484

(22) Filed: Jul. 4, 2013

(65) Prior Publication Data

US 2015/0008940 A1    Jan. 8, 2015

(51) Int. Cl.
*G01R 29/00* (2006.01)
*G01R 29/26* (2006.01)
*G01R 31/317* (2006.01)

(52) U.S. Cl.
CPC . *G01R 31/31709* (2013.01); *G01R 31/31727* (2013.01)

(58) Field of Classification Search
CPC .. G01R 29/26; G01R 23/175; G01R 13/0254; G01R 31/31709; G01S 13/755; G01S 17/10
USPC ..... 324/613, 76.11, 76.21; 702/69, 189, 190
See application file for complete search history.

(56) References Cited

U.S. PATENT DOCUMENTS

| 5,293,520 A | 3/1994 | Hayashi |
| 6,011,824 A | 1/2000 | Oikawa et al. |
| 6,795,496 B1 * | 9/2004 | Soma ................. G01R 29/26 324/620 |

(Continued)

FOREIGN PATENT DOCUMENTS

| CN | 1910939 A | 2/2007 |
| CN | 101548467 A | 9/2009 |

(Continued)

OTHER PUBLICATIONS

Taiwanese Office Action and Search Report from Taiwanese Application No. 102148423, dated Jun. 22, 2015.

(Continued)

*Primary Examiner* — Roy Y Yi
*Assistant Examiner* — Jeffrey Aiello
(74) *Attorney, Agent, or Firm* — Zilka-Kotab, PC

(57) ABSTRACT

Disclosed are a method, system, and/or apparatus to perform clock jitter and power supply noise analysis. In one embodiment, a method may include receiving a first signal, which may be a clock signal, then generating a second signal based on the first signal. The method may further include delaying the second signal by a base delay and/or a series of fine delays. The method may also include taking measurements of the delayed second signal and comparing those measurements to theoretical measurements of the second signal that would occur if the first signal were noise-free. The method may further include determining, based on the measurements and the comparison thereof, whether noise is present, whether the noise is high frequency or low frequency noise, and whether the noise is due to clock jitter and/or power supply deviations.

20 Claims, 18 Drawing Sheets

(56) References Cited

U.S. PATENT DOCUMENTS

| | | | | |
|---|---|---|---|---|
| 7,292,947 | B1* | 11/2007 | Tabatabaei | G01R 31/31709 702/191 |
| 7,791,330 | B2* | 9/2010 | Heidel | G01R 31/3016 324/613 |
| 7,890,279 | B1* | 2/2011 | Chow | G06F 17/5036 702/72 |
| 8,134,384 | B2* | 3/2012 | Weizman | G01R 31/3004 324/613 |
| 2002/0121890 | A1* | 9/2002 | Levitt | G01R 23/175 324/76.36 |
| 2003/0198309 | A1* | 10/2003 | Abrosimov | G01R 31/31725 375/354 |
| 2005/0083024 | A1 | 4/2005 | Harris et al. | |
| 2005/0273320 | A1* | 12/2005 | Yamaguchi | G01R 23/16 704/205 |
| 2007/0007970 | A1* | 1/2007 | Neuman | G01R 31/31721 324/613 |
| 2007/0030044 | A1* | 2/2007 | Lutkemeyer | H03L 7/0812 327/158 |
| 2008/0309364 | A1* | 12/2008 | Joshi | G01R 31/31725 324/750.02 |
| 2009/0146751 | A1 | 6/2009 | Pernia et al. | |
| 2010/0001780 | A1* | 1/2010 | Janot | G04F 10/005 327/335 |
| 2010/0063761 | A1 | 3/2010 | Frenkil | |
| 2010/0265139 | A1* | 10/2010 | Beadle | G01S 3/14 342/451 |
| 2011/0128055 | A1* | 6/2011 | Pelgrom | G01R 31/31709 327/156 |
| 2011/0295536 | A1 | 12/2011 | Yoda et al. | |
| 2012/0288034 | A1* | 11/2012 | Fireaizen | H03M 1/1205 375/340 |
| 2013/0070830 | A1 | 3/2013 | Le-Gall | |
| 2015/0177304 | A1* | 6/2015 | Valka | G01R 31/31709 324/613 |
| 2015/0221313 | A1* | 8/2015 | Purnhagen | G10L 19/008 704/500 |

FOREIGN PATENT DOCUMENTS

| | | |
|---|---|---|
| JP | 2012073240 A | 4/2012 |
| TW | 201315154 A | 4/2013 |

OTHER PUBLICATIONS

Heydari, P., "Analysis of Jitter due to Power-Supply Noise in Phase-Locked Loops," 2006, pp. 1-12, retrieved from www.atrak.usc.edu/~massoud/Papers/supplynoise-talk.pdf.

Office Action from Chinese Patent Application No. 201410318344.7, dated Jun. 28, 2016.

* cited by examiner

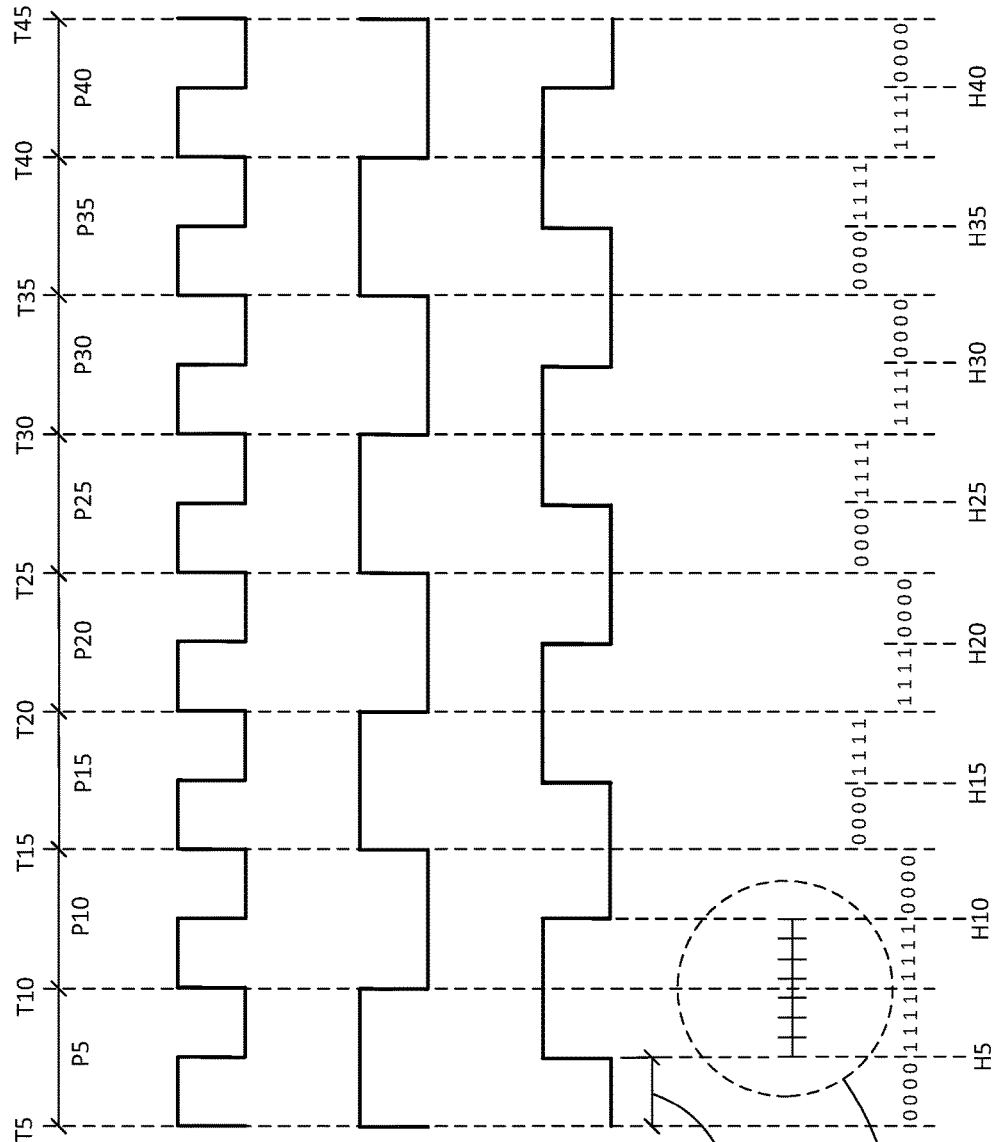

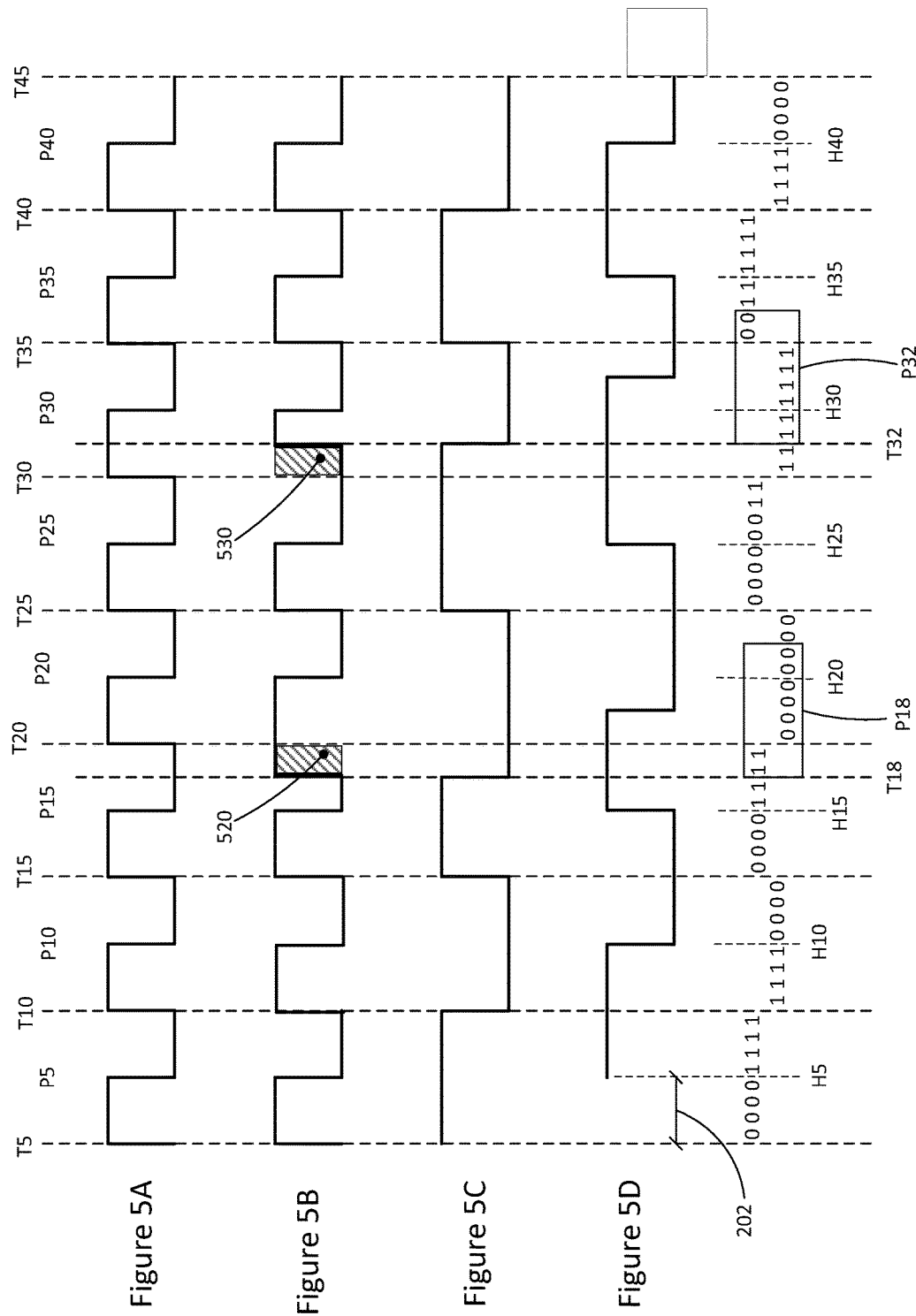

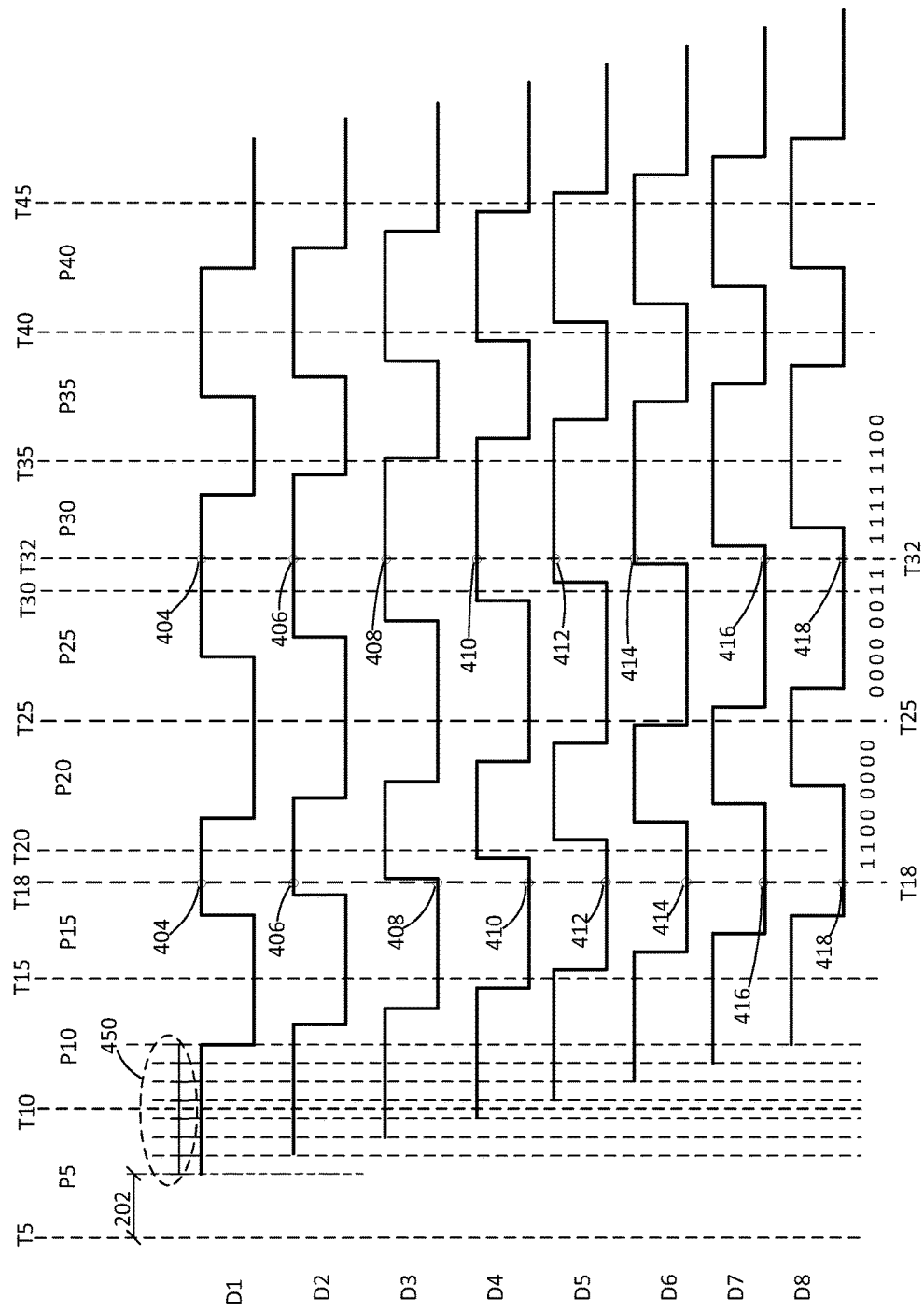

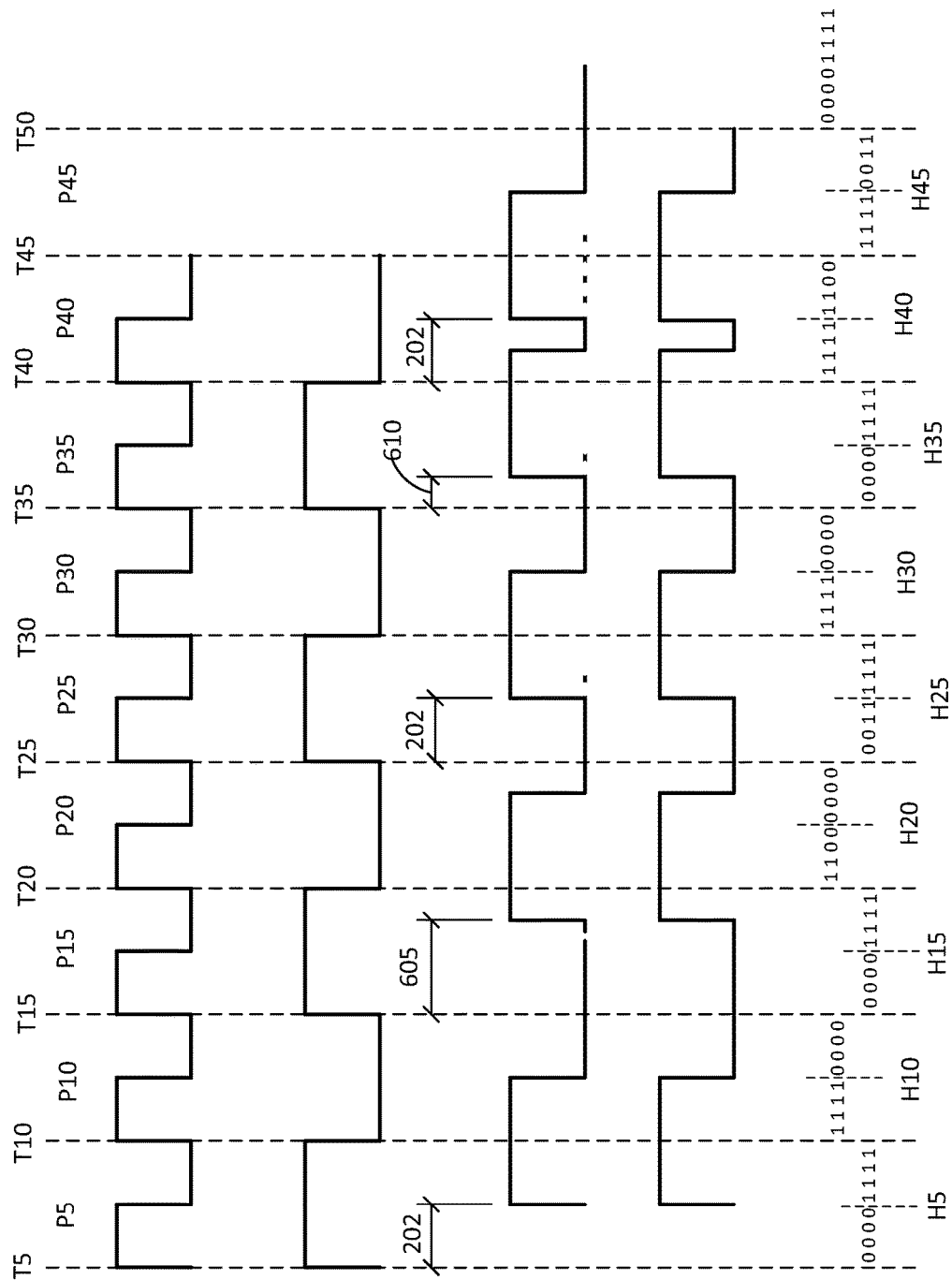

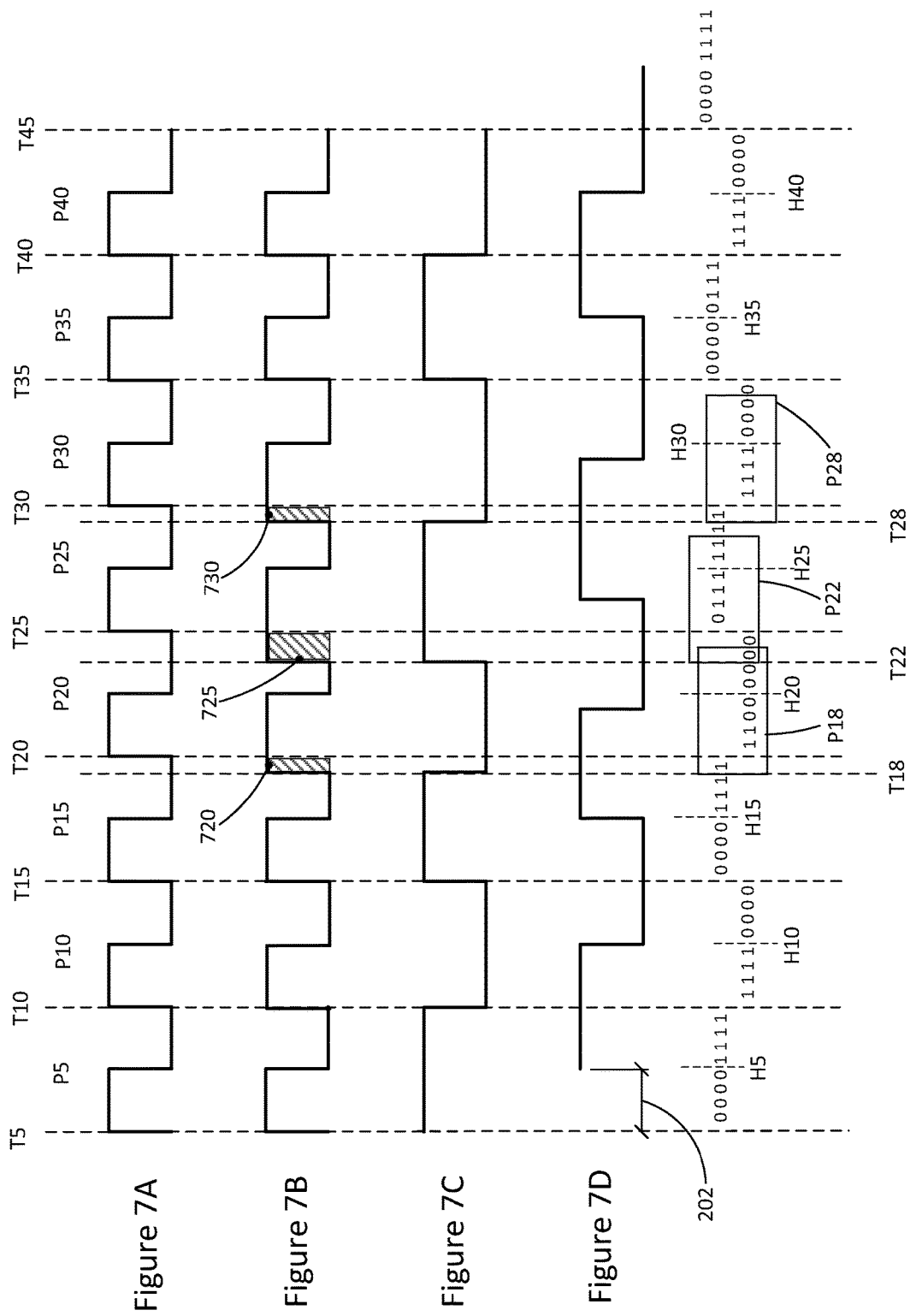

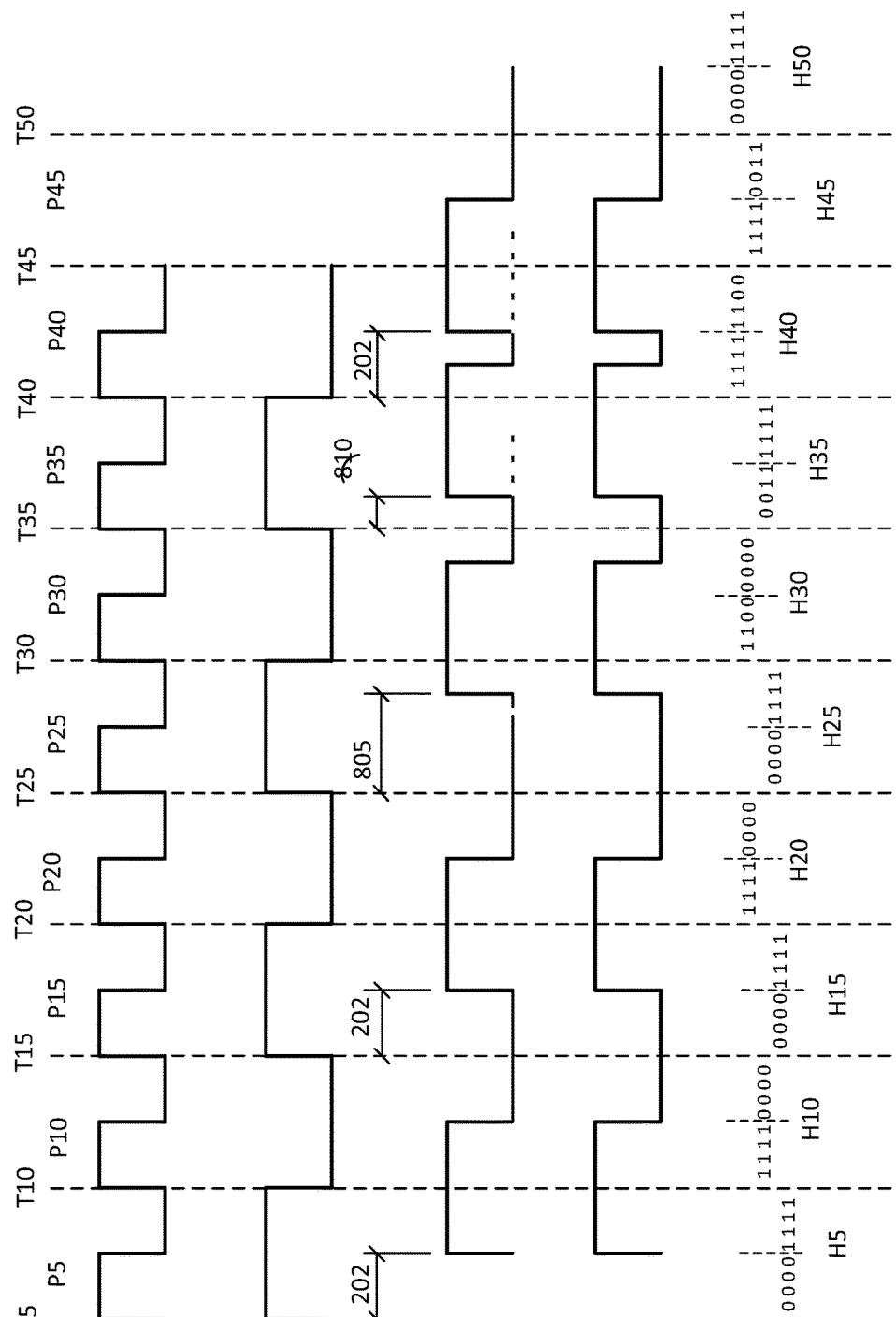

CLOCK JITTER AND POWER SUPPLY NOISE ANALYSIS

FIELD OF TECHNOLOGY

This disclosure relates generally to data processing devices and, more particularly, to a method, a device and/or a system of detecting and analyzing noise signatures.

BACKGROUND

Applications for signal processing are broad and continue to increase. Examples of signal processing applications include transmission and reception of messages by mobile devices, speech recognition, and clock signals used to time internal operations of CPUs and GPUs.

Signals may be composed of multiple frequencies. The lowest frequency that makes up part of a signal is known as the fundamental frequency of the signal. Signals may also include unwanted components, known as noise. The presence of noise in a signal may reduce signal performance in an application. A noisy signal may transmit erroneous or incomplete information. Noise may have particular characteristics which can be thought of as a signature. For example, noise may be characterized as low frequency or high frequency. Low frequency noise may be noise that occurs at a frequency lower than the fundamental frequency of a signal. High frequency noise, then, may be all noise other than low frequency noise. Detecting and analyzing a noise signature may allow the source of the noise to be determined, eliminated and/or reduced.

SUMMARY

Disclosed are a method, a device and/or a system of detecting and analyzing noise signatures.

In one aspect, a method to detect and analyze noise signatures is disclosed. In this aspect, the method comprises receiving a first signal by a noise analyzer. In addition, the method may involve generating, through the noise analyzer, a second signal based on the first signal and temporally displacing, through a base delay, the second signal by a base delay time. In one aspect, the method may further involve comparing, through a comparator, an actual measurement of the temporally displaced second signal to a theoretical measurement of a third theoretical signal, wherein the third theoretical signal is a version of the second signal which would be generated from the first signal if the first signal were free from both high frequency noise and low frequency noise.

In another aspect, a system to detect and analyze noise signatures is disclosed. In this aspect, the system comprises a signal generator configured to receive a first signal and generate a second signal based on the first signal. In one aspect, the system may further comprise a base delay element configured to temporally displace the second signal by a first temporal delay, a plurality of fine delay elements configured to further temporally displace the second signal by at least one fine temporal delay; and a comparator configured to compare an actual measurement of the temporally displaced second signal to a theoretical measurement of a third theoretical signal, wherein the third theoretical signal is a version of the second signal which would be generated from the first signal if the first signal were free from both high frequency noise and low frequency noise.

In another aspect, a noise analyzer to detect and analyze noise signatures is disclosed. In one aspect, the noise analyzer may comprise a signal generator configured to receive a first signal and generate a second signal based on the first signal. In one aspect, the noise analyzer may further comprise a base delay element configured to temporally displace the second signal by a first temporal delay; and a comparator configured to compare an actual measurement of the temporally displaced second signal to a theoretical measurement of a third theoretical signal, wherein the third theoretical signal is a version of the second signal which would be generated from the first signal if the first signal were free from both high frequency noise and low frequency noise.

The methods and systems disclosed herein may be implemented in any means for achieving various aspects, and may be executed in a form of a non-transitory machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which:

FIG. 4A is a waveform illustrating a square wave which may represent a noise-free digital clock signal, according to one or more embodiments.

FIG. 4B is a waveform illustrating a signal generated from the square wave of FIG. 4A, according to one or more embodiments.

FIG. 4C is a waveform illustrating the signal of FIG. 4B displaced by a base delay and the location of measurements that may be taken by a noise analyzer, according to one or more embodiments.

FIG. 5A is a waveform illustrating a square wave which may represent a noise-free digital clock signal, according to one or more embodiments.

FIG. 5B is a waveform illustrating a square wave containing high frequency noise which may represent a clock signal containing high frequency jitter, according to one or more embodiments.

FIG. 5C is a waveform illustrating a square wave which represents a signal generated from the waveform of FIG. 5B, according to one or more embodiments.

FIG. 5D is a waveform illustrating the square wave of FIG. 5C displaced by a base delay, according to one or more embodiments, and also shows values of measurements which may be taken of the waveform.

FIG. 5E is a series of waveforms illustrating how a noise analyzer may take measurements after a base delay and a series of fine delays.

FIG. 6A is a waveform illustrating a square wave which may represent a noise-free digital clock signal, according to one or more embodiments.

FIG. 6B is a waveform illustrating a square wave which represents a signal generated from the waveform of FIG. 6A, according to one or more embodiments.

FIG. 6C is a waveform illustrating portions of the waveform of FIG. 6B having been displaced by delays which may represent high frequency supply noise, and also shows, via dashed lines, the locations which may have been occupied by the waveform if no noise were present, according to one or more embodiments.

FIG. 6D is a waveform illustrating portions of the waveform of FIG. 6B having been displaced by delays which may represent high frequency supply noise and also shows values of measurements which may be taken of the waveform, according to one or more embodiments.

FIG. 7A is a waveform illustrating a square wave which may represent a noise-free digital clock signal, according to one or more embodiments.

FIG. 7B is a waveform illustrating a square wave containing low frequency noise which may represent a clock signal containing low frequency jitter, according to one or more embodiments.

FIG. 7C is a waveform illustrating a square wave which represents a signal generated from the waveform of FIG. 7B, according to one or more embodiments.

FIG. 7D is a waveform illustrating the square wave of FIG. 7C displaced by a base delay, and also shows values of measurements which may be taken of the waveform, according to one or more embodiments.

FIG. 8A is a waveform illustrating a square wave which may represent a noise-free digital clock signal, according to one or more embodiments.

FIG. 8B is a waveform illustrating a square wave which represents a signal generated from the waveform of FIG. 8A, according to one or more embodiments.

FIG. 8C is a waveform illustrating portions of the waveform of FIG. 8B having been displaced by delays which may represent low frequency supply noise, and also shows, via dashed lines, the locations which may have been occupied by the waveform if no noise were present, according to one or more embodiments.

FIG. 8D is a waveform illustrating portions of the waveform of FIG. 8B having been displaced by delays which may represent low frequency supply noise and also shows values of measurements which may be taken of the waveform, according to one or more embodiments.

Other features of the present embodiments will be apparent from the accompanying drawings and from the detailed description that follows.

DETAILED DESCRIPTION

Example embodiments, as described below, may be used to provide a method, a system and/or a device to analyze noise within a signal. The example embodiments may detect and analyze unique characteristics of noise contained within a signal, with the unique characteristics being used to determine a signature of a particular type of noise. The example embodiments may detect the aforementioned characteristics by taking measurements of a signal, and/or a metasignal which may be generated using information contained in the signal, and/or noise, and/or multiple and/or theoretical versions of the aforementioned. The term "measurement," as used herein, may be synonymous with the term "sample."

Figure 1:
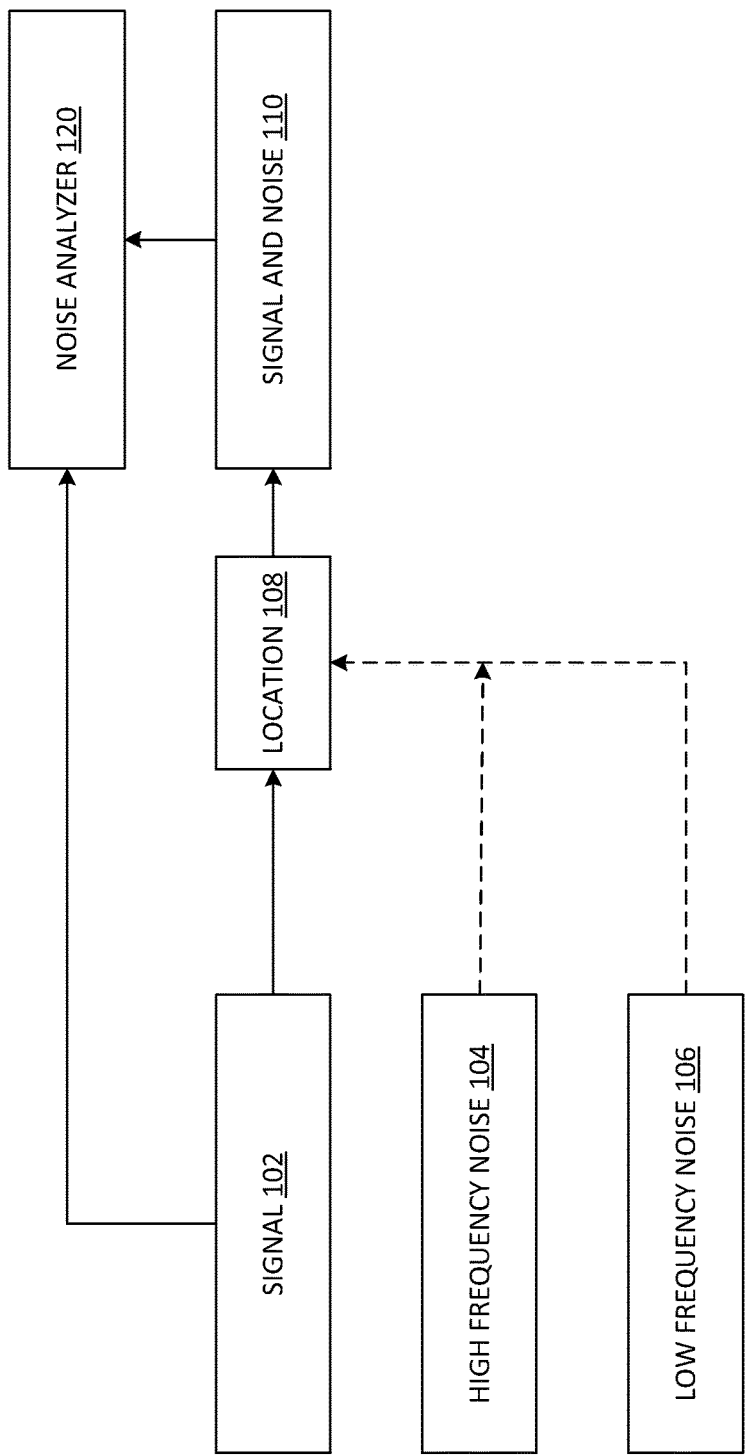
FIG. 1 is a block diagram of a noise analyzer, according to one or more embodiments.

FIG. 1 illustrates a block diagram of a system comprising a noise analyzer 120, according to one or more embodiments. In this or other embodiments, a signal 102 received at the noise analyzer 120 may be free from noise, wherein noise constitutes unwanted characteristics of an electric signal. The signal 102 may be an analog or a digital signal. Signal 102 may be represented by a waveform, the waveform thereof comprising one or more frequencies, with the lowest frequency of the waveform being a fundamental frequency. Low frequency noise 106 comprises noise which may occur at a frequency lower than the fundamental frequency of signal 102. High frequency noise 104 may be noise that occurs at a frequency greater than that of low frequency noise 106. Low frequency noise 106 and/or high frequency noise 104 may be combined with signal 102 at a location 108. The location 108 may be a physical location, a temporal location, or a combination of both. The aforementioned low frequency noise 106 and/or high frequency noise 104 may be inadvertently generated and combined with signal 102, and/or intentionally generated and combined with signal 102. In one or more embodiments, signal 102 may be an actual signal received by noise analyzer 120, and/or a theoretical signal which may be generated by noise analyzer 120 to represent a noise-free signal.

In one or more embodiments, signal 102 and/or signal and noise 110 may be received by noise analyzer 120 in real time, received after one or more delays, and/or recorded by another device or system, then accessed by noise analyzer 120. Noise analyzer 120 may then perform operations on signal and noise 110 which compare signal and noise 110 to the noise-free signal 102, the operations performed by noise analyzer 120 may compare signal and noise 110 and noise-free signal 102 in order to determine unique characteristics of the noise contained within signal and noise 110. The aforementioned unique characteristics may be used to determine the source of the noise contained within signal and noise 110.

In one or more embodiments, operations performed by noise analyzer 120 may comprise generating a first new signal based on signal and noise 110, temporally shifting the new signal in relation to signal 102, generating a second new signal based on signal 102, measuring the temporally shifted first new signal, measuring the second new signal, and comparing the aforementioned measurements in order to determine the unique characteristics of the noise contained in signal and noise 110. In one or more embodiments, noise analyzer 120 may also temporally shift the second new signal.

In one example, signal 102 may be a clock signal of a computing system. The computing system may contain a memory, a clock, and a processor (the processor may be a CPU, GPU, ASIC, FPGA, an analog system, or other means of performing computational operations). Clock signal 102 may be represented by a square wave, with the square wave having a high value, which may be represented as 1, for periodically repeating definite periods, and a low value, which may be represented as 0, for periodically repeating definite periods. A cycle of clock signal 102 may comprise a single high period combined with a single low period. The high value of clock signal 102 may represent a one (1) and the low value may represent a zero (0). Clock signal 102 may be used to synchronize operations within a computing system. In one example, the periods of clock signal 102 may be subjected to random variations. Random variations which take place in a time period less than that of a clock cycle may be high frequency noise 104, and random variations which last longer than a single clock cycle may be low frequency noise 106. The aforementioned low frequency noise and/or high frequency noise which affects clock signal 102 may be low frequency jitter and/or high frequency jitter.

In one example, the processing speed of a processor within a computing system may be affected by a level of a power supply. For example, if the power supply of the computing system supplies a higher level of power than a designed level of power, the processor may operate at a faster speed than its design speed, and complete operations at a rate faster than the design rate. Conversely, if the power supplied by the power supply is less than the designed level of power, the processor may operate at a slower speed than its design speed, and complete operations at a rate slower than the design rate. Random variations in the power supply may be power supply noise. Power supply noise which lasts for a time period less than a clock cycle may be high frequency noise 104. Power supply noise which lasts for a time period greater than, or equal to, a clock cycle may be low frequency noise 106.

Figure 2:
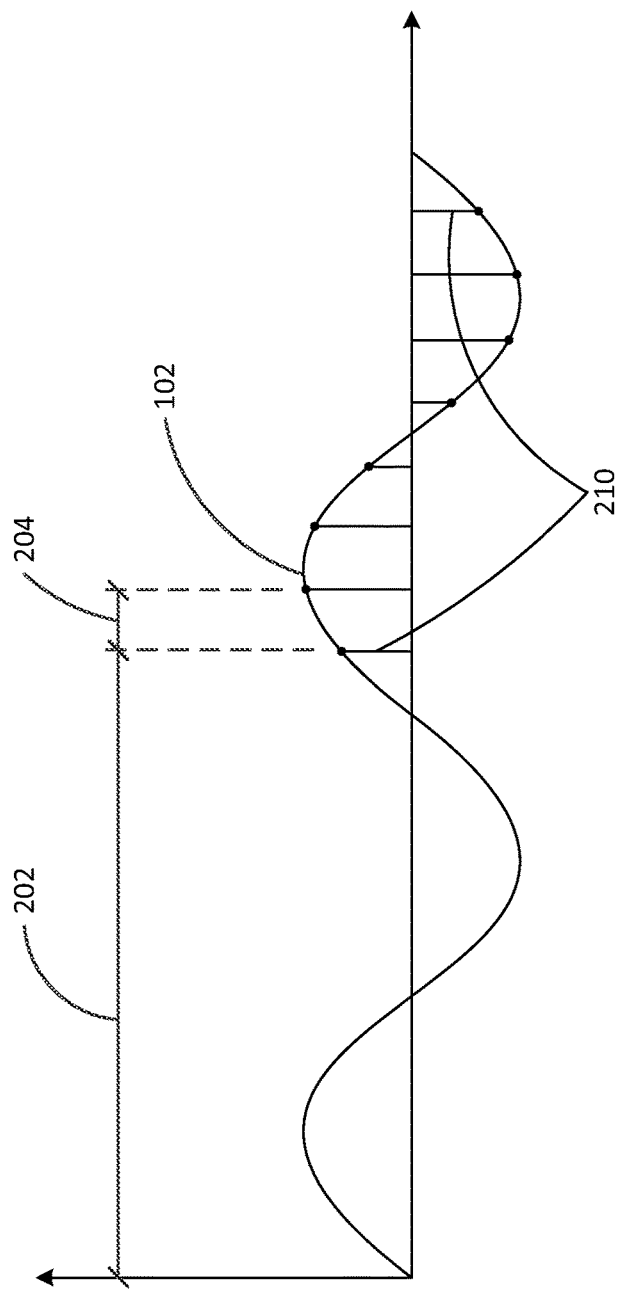
FIG. 2 is a waveform illustrating a noise-free analog signal and showing points along the waveform where a noise analyzer may take measurements of the signal, according to one or more embodiments.

FIG. 2 shows, according to one or more embodiments, a noise-free analog version of signal 102, represented by a sine wave. Base delay 202 may be applied to signal 102 by noise analyzer 120. Noise analyzer 120 may take measurements 210 of signal 102 after base delay 202, and subsequently after fine delay 204. Though shown as signal 102 in the figure, the sine wave may also represent a signal generated by noise analyzer 120 based on signal 102, and/or signal and noise 110, and may be phase-shifted by an amount corresponding to base delay 202, and/or phase-shifted by other amounts which may correspond to fine delay 204 and/or other amounts.

Figure 3A:
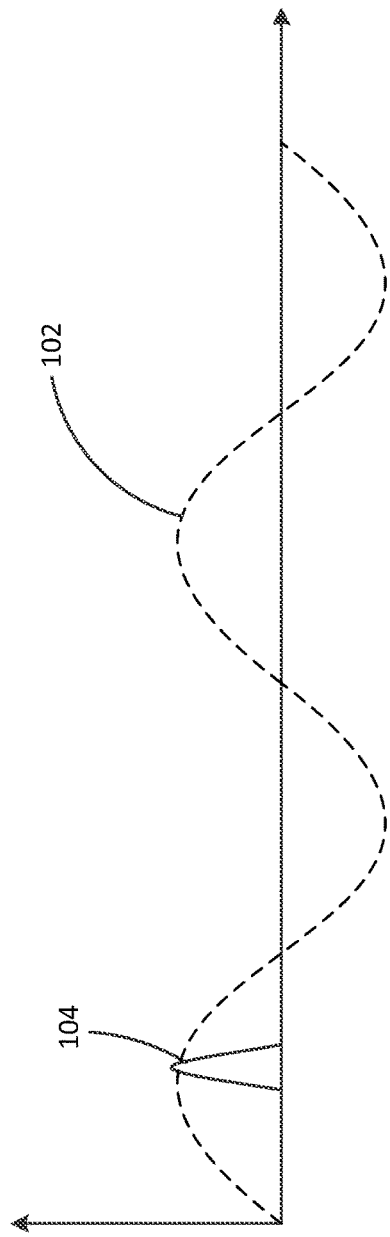
FIG. 3A is a waveform illustrating a high frequency noise as compared to a noise-free analog signal, according to one or more embodiments.

FIG. 3A shows, according to one or more embodiments, an analog example of high frequency noise 104 as compared to signal 102.

Figure 3B:
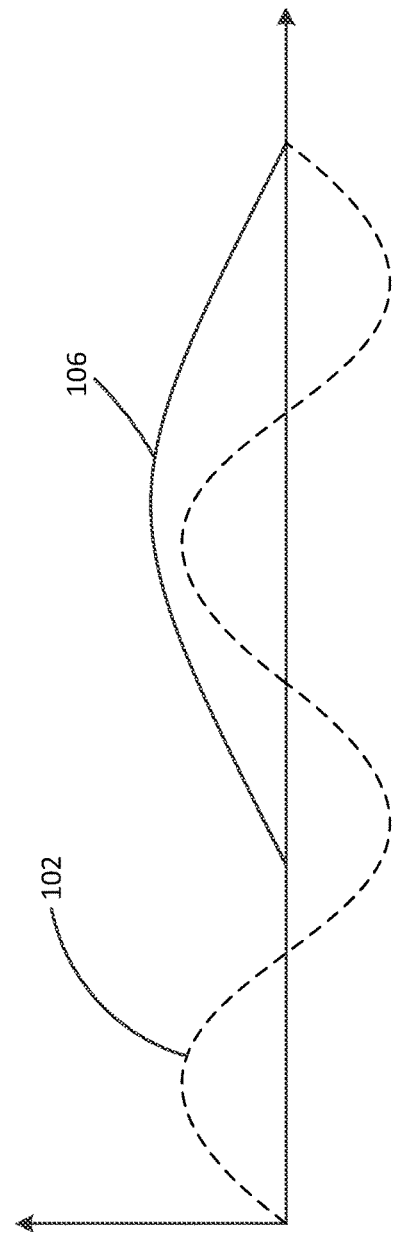
FIG. 3B is a waveform illustrating a low frequency noise as compared to a noise-free analog signal, according to one or more embodiments.

FIG. 3B shows, according to one or more embodiments, an analog example of low frequency noise 106 as compared to signal 102.

Figure 3C:
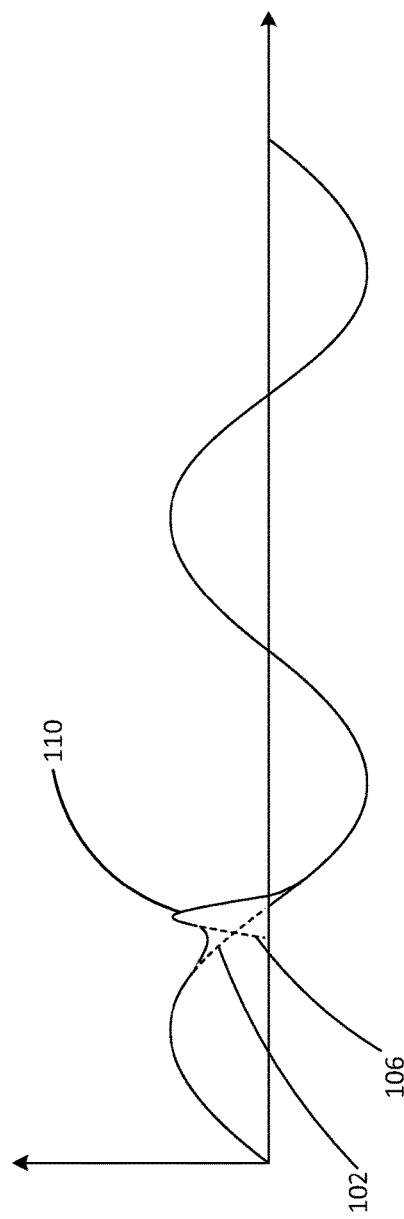
FIG. 3C is a waveform illustrating a combination of a signal and a high frequency noise, according to one or more embodiments.

FIG. 3C shows, according to one or more embodiments, an example of analog high frequency noise 104 being combined with signal 102 to create signal and noise 110.

Figure 3D:
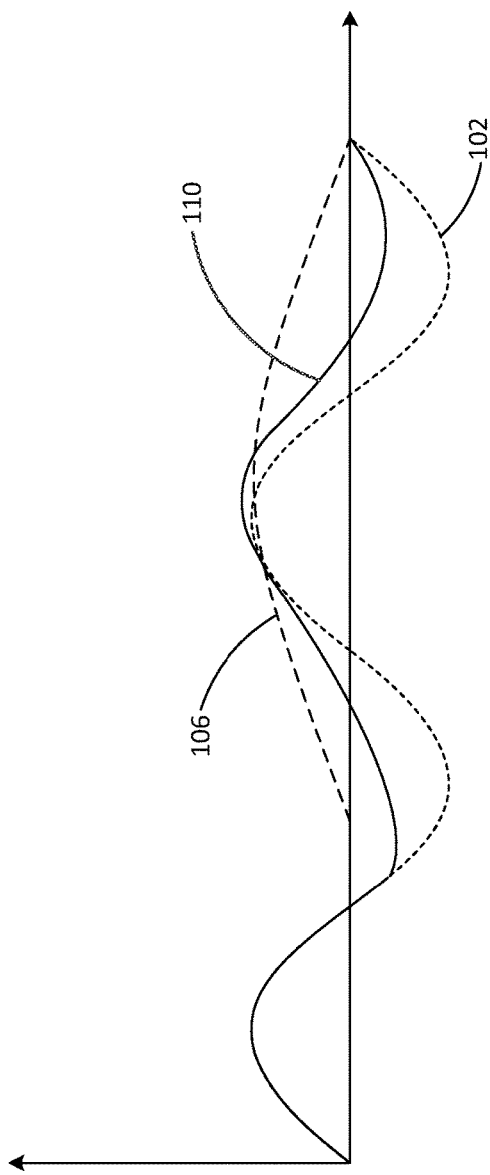
FIG. 3D is a waveform illustrating a combination of a signal and a low frequency noise, according to one or more embodiments.

FIG. 3D shows, according to one or more embodiments, an example of analog low frequency noise 106 being combined with signal 102 to create signal and noise 110.

Figure 3E:
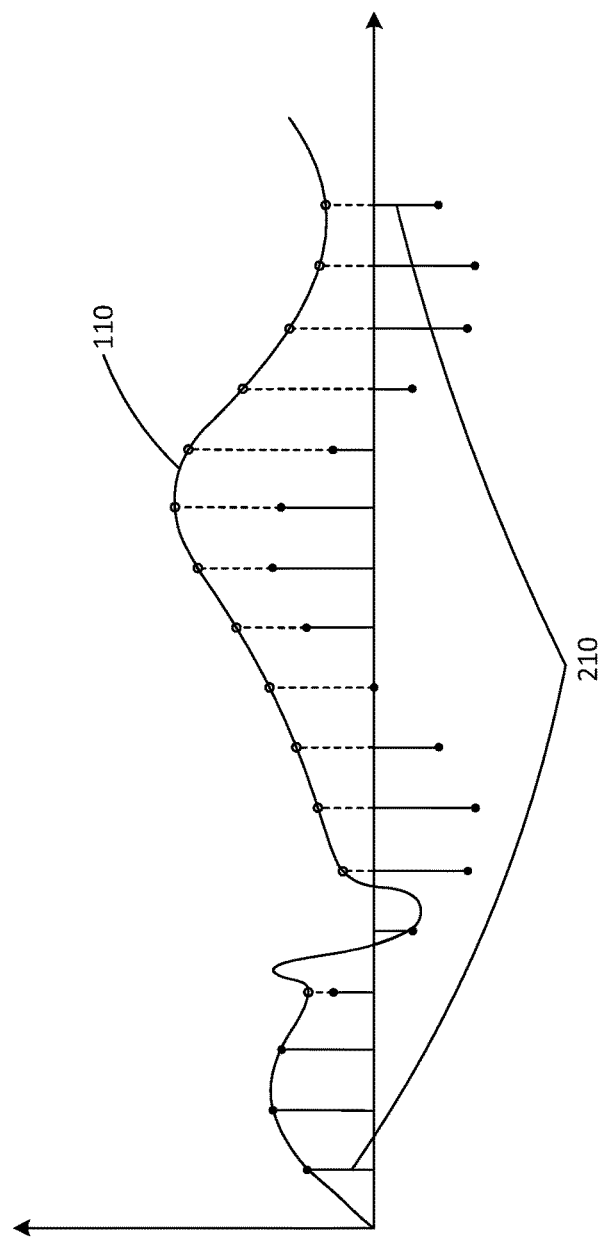
FIG. 3E is a waveform illustrating a combination of a signal with a low frequency and a high frequency noise, and shows the location of measurements that may be taken by a noise analyzer, according to one or more embodiments.

FIG. 3E shows, according to one or more embodiments, an example of both analog high frequency noise 104 and analog low frequency noise 106 being combined with signal 102 to create signal and noise 110. FIG. 3E also shows a series of measurements 210 which may be taken by noise analyzer 120, wherein the solid lines and closed circular endpoints may represent measurements which would have been taken of a noise-free signal 102, and the dashed lines and open circular endpoints may represent measurements which would be taken of the signal and noise 110. Noise analyzer 120 may compare the previously mentioned measurements to determine a noise signature; that is, whether the noise is high frequency, low frequency, and/or the potential source and/or sources of the noise. The aforementioned comparisons performed by noise analyzer 120, may, for example, include subtracting the measurements which would be taken of a noise-free signal 102 from measurements which would be taken of signal and noise 110, then determining whether there are differences between an ideal noise-free signal 102, and signal and noise 110; and further determining the time frame during which the differences in measurements may be present. For example, noise analyzer 120 may determine that there are differences between a noise-free signal 102 and signal and noise 110 that are present for a period less than the fundamental frequency of signal 102, these differences may represent high frequency noise 104. Alternatively, noise analyzer 120 may determine that there are differences between a noise-free signal 102 and signal and noise 110 that are present for a period greater than the fundamental frequency of signal 102, these differences may represent low frequency noise 106. In another example, noise analyzer may determine that both types of aforementioned differences between signal 102 and signal and noise 110 are present, which may indicate the presence of both high frequency noise 104 and low frequency noise 106. Noise analyzer 120 may take multiple sets of measurements of signal 102 and signal and noise 110, these measurements may be repeated at definite times, with the timing between measurements being related to the frequency or frequencies of signal 102.

In one or more embodiments, noise analyzer 120 may generate a metasignal and/or metasignals based on signal 102 and/or signal and noise 110. In one or more embodiments, a metasignal may incorporate information about the signal on which it is based in the frequency, period, amplitude, and/or variability of the metasignal. In one or more embodiments, noise analyzer 120 may temporally shift one or more of the aforementioned metasignals, take a series of measurements 210 of one or more of the metasignals, and compare those measurements 210 with equivalent measurements of one or more other metasignals and/or signal 102, and/or signal and noise 110 in order to determine unique characteristics of signal and noise 110 which may constitute a noise signature.

Analog waveforms, as shown in FIGS. 2-3E, may be converted into digital waveforms by assigning discrete values to measurements of the analog waveform taken at a particular sampling rate. In a simple example, one value may be assigned to a portion of a waveform above a certain level, and another value to remaining portions of the waveform. For example, values of an analog waveform above a horizontal axis could be regarded as high, or one (1) and the remaining values below or on the horizontal axis could be regarded as low, or zero (0); or vice-versa. The dividing line between high and low values could also be set at a level different from the horizontal axis. The reverse process, of converting a digital waveform to an analog waveform, may also be done, for example, by interpolating the discrete values of the digital waveform to create a corresponding analog waveform. Therefore, embodiments described herein that operate on analog signals may be applied to digital signals, and vice-versa.

FIG. 4A shows, according to one or more embodiments, a square wave which may be a noise-free digital signal, which in turn may represent a noise-free clock signal.

FIG. 4B shows, according to one or more embodiments, a new signal which may be generated by noise analyzer 120 from the clock signal of FIG. 4A. The new signal of FIG. 4B may be a square wave that has a high value for one period of the clock cycle of FIG. 4A, then a low value for the next period of the clock cycle of FIG. 4A, with the high and low values of the new signal of FIG. 4B alternating with the clock cycles shown in FIG. 4A. The new waveform of FIG. 4B may be a metasignal, in that it may be a new signal which contains information based on the first signal of FIG. 4A.

FIG. 4C shows, according to one or more embodiments, the signal from FIG. 4B being temporally offset by base delay 202. FIG. 4C further shows a series of fine delay elements 450. Series of fine delay elements 450 may indicate temporal locations where noise analyzer 120 may take measurements of signal 102, signal and noise 110, and/or a new signal created by noise analyzer 120 based on signal 102 and/or signal and noise 110. Fine delay elements 450 may, in another embodiment, indicate a set of delays which may be applied to signal 102, signal and noise 110, and/or a new signal created by noise analyzer 120 based on signal 102 and/or signal and noise 110. An enlarged detail of series of fine delay elements 450 is shown in FIG. 4F, for clarity.

Vertical dashed lines in FIGS. 4A-4E, and in other included figures containing waveforms, represent common temporal locations of the waveforms depicted, and are designated by reference numbers T5, T10, T15, etc. The time periods between the temporal locations are designated by reference numbers P5, P10, P15, etc. The half-way points through each time period (P5, P10, P15, etc.) are designated H5, H10, H15, etc.

In FIG. 4C, according to one or more embodiments, base delay 202 and series of fine delay elements 450 are set so that a portion of the signal generated in FIG. 4B during an initial time period propagates exactly half-way through the series of fine delay elements 450 in the subsequent time period, or a later time period. In one example, a portion of the metasignal of FIG. 4B, which may be generated by noise analyzer 120 during the time period P5, may propagate to the half-way point H10, exactly half-way between T10 and T15, during subsequent time period P10; the portion of metasignal generated during time period P10 may propagate to half-way point H15 during time period P15, and so on. In one or more embodiments, the aforementioned propagation of the metasignal of FIG. 4C generated in one time period to an exact half-way point in the subsequent time period may the result of selectively setting the base delay 202 and series of fine delay elements 450 such that the exact half-way propagation is achieved. The resulting exact half-way propagation, according to one or more embodiments, may be indicative of a noise-free initial signal as exemplified by FIG. 4A.

Figure 4D:
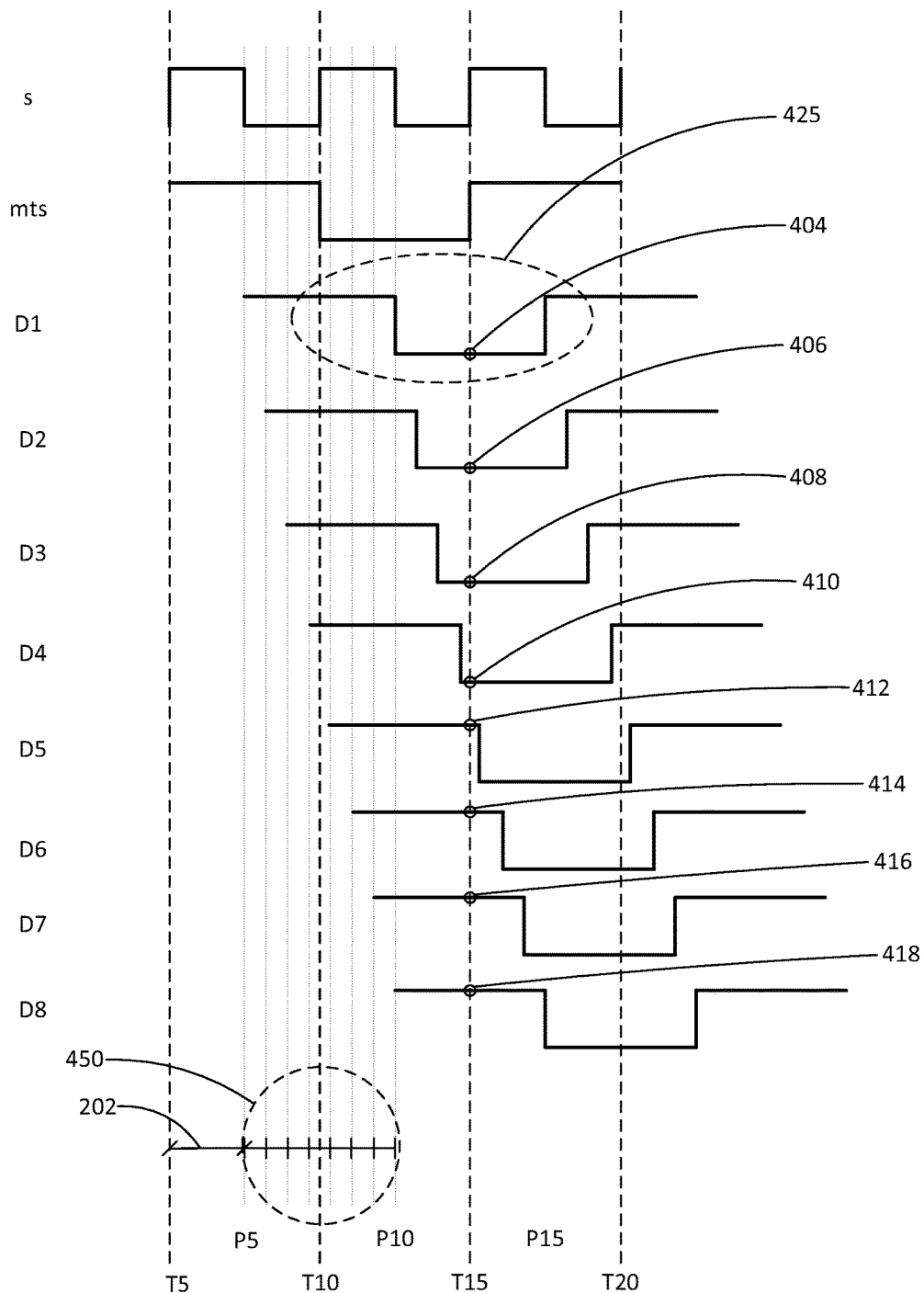
FIG. 4D is a series of waveforms; the waveform "s" may represent an initial signal, the waveform "mts" may represent a metasignal, which may be created from information contained in initial signal, and waveforms D1 through D8 may represent delayed versions of the mts, according to one or more embodiments.

FIG. 4D illustrates, according to one or more embodiments, a series of waveforms, wherein waveform "s" may represent an initial signal, waveform "mts" may represent a metasignal, which may be created by noise analyzer 120 from information contained in initial signal s, and waveforms D1 through D8 may represent delayed versions of the mts. In one embodiment, waveform s may be similar to the waveform shown in FIG. 4A, and may represent a noise-free clock signal. In one embodiment, waveform mts may be similar to the waveform shown in FIG. 4B, and may represent a metasignal containing information describing waveform s. In one example, mts may be generated by noise analyzer 120 from s by alternating the value of mts between low and high values for successive periods of the signal s, for example, by setting the value of mts high (or 1) for one period of s, then setting the value of mts low (or 0) for the next period of s, setting mts low for the subsequent period of s, and so on. Waveform D1 may represent the mts signal delayed by base delay 202. Waveform D2 may represent mts delayed by both base delay 202 and one of the series of fine delays 450. Waveform D3 may represent mts delayed by base delay 202 and two of the series of fine delays 450. Waveform D4 may represent mts delayed by base delay 202 and three of the series of fine delays 450. Waveform D5 may represent mts delayed by base delay 202 and four of fine delays 450, D6 may represent mts delayed by base delay 202 plus five of fine delays 450, D7; base delay 202 plus six fine delays 450; and, finally, D8 may represent mts delayed by base delay 202 plus seven of series of fine delays 450. Vertical dotted lines in FIG. 4D may represent the successive periods of the aforementioned delays. Though series of fine delays 450 are shown to be divided into equal time periods in FIG. 4D, they may comprise differing time periods. For example, the second fine delay in series of fine delays 450 may be a multiple of the first fine delay in series of fine delays 450. In one embodiment, metasignal mts may be first generated having a high value beginning at time T5, then switching to a low value at time T10, the time between T5 and T10 being period P5. Metasignal mts may then, in one embodiment, be delayed by base delay 202 and series of fine delays 450, so that the mts values generated during period P5 are propagated so that at time T15, exactly one half of them are on one side of time T15, and the other half are on the other side of time T15. At time T15, which may correspond to a rising edge of a clock signal, which may be represented by signal s, noise analyzer 120 may take measurements (404, 406, 408, 410, 412, 414, 416, 418). The aforementioned measurements, if taken at time T15 in FIG. 4D, would have values as shown in Table 1 below.

TABLE 1

| BIT MEASURED | MEASUREMENT REFERENCE NUMBER | VALUE |
|---|---|---|
| 1 | 404 | 0 |
| 2 | 406 | 0 |
| 3 | 408 | 0 |
| 4 | 410 | 0 |
| 5 | 412 | 1 |
| 6 | 414 | 1 |
| 7 | 416 | 1 |
| 8 | 418 | 1 |

Figure 4E:
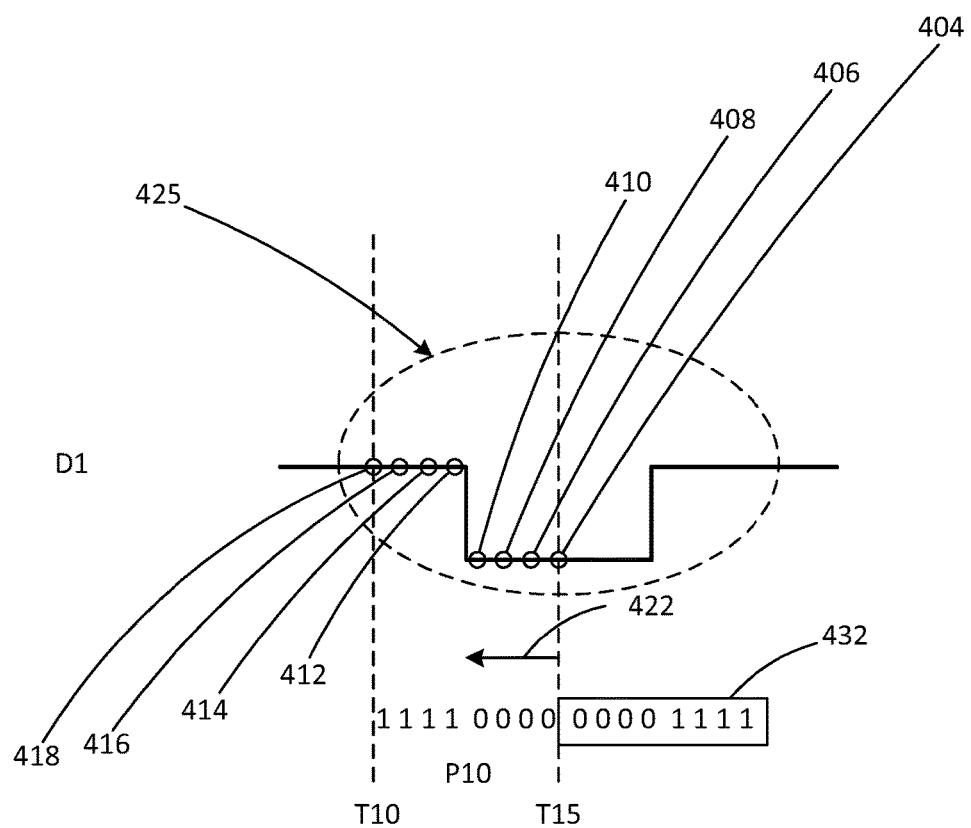
FIG. 4E is an enlarged detail of a section of the D1 waveform from FIG. 4D, according to one or more embodiments.
Figure 4F:
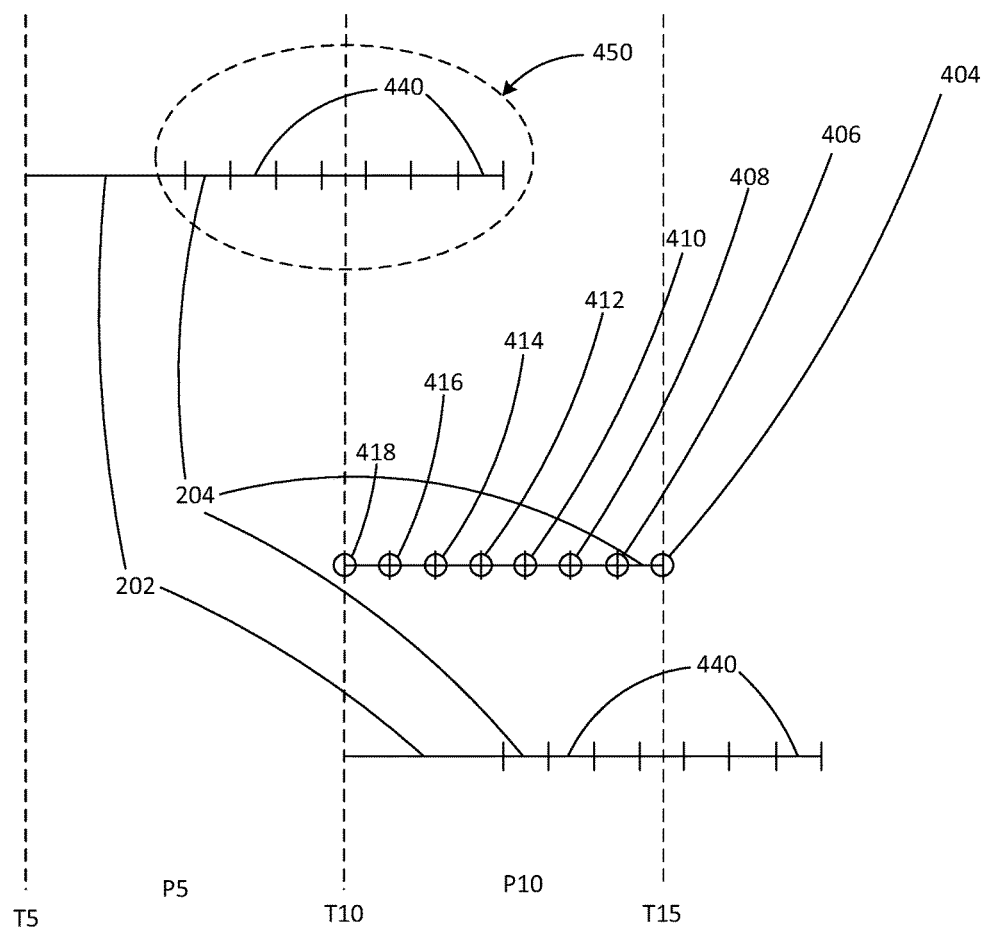
FIG. 4F is an enlarged detail of the location of measurements that may be taken by a noise analyzer, according to one or more embodiments.

Though Table 1, above, shows 8 bits being measured by noise analyzer 120, any alternative number of bit measurements may be taken by noise analyzer 120. The number of fine delay elements required in the series of fine delay elements 450 will be equal to the desired number of bits to be measured, minus 1. For example, in measuring the 8 bits above, one base delay 202 may be used, and seven fine delay elements may be used in series of fine delay elements 450. In order to measure 10 bits, for example, noise analyzer 120 may use one base delay 202, and nine fine delay elements in series of fine delay elements 450. An enlarged detail of waveform D1 425 from FIG. 4D is shown in FIG. 4E. An enlarged detail of the series of fine delay elements 450 is shown in FIG. 4F.

FIG. 4E shows, according to one or more embodiments, an enlarged detail 425 of a portion of waveform D1 from FIG. 4D. Waveform D1 is a square wave which, in one embodiment, may represent a metasignal generated from an initial square wave, the initial square wave in turn may represent a clock signal. In the example shown, the initial clock signal and the metasignal may represent signals which are free from noise. Waveform D1 may be a version of a metasignal that has been delayed by a base delay 202. As shown in previous FIG. 4D, noise analyzer 120 may take measurements of delayed waveforms at time T15. FIG. 4D shows the measurements (404-418) which may be taken by noise analyzer 120 being taken from various delayed versions (D1 D8) of the metasignal, mts, at specific time T15. An alternate way of arriving at the measurements taken, according to one or more embodiments, is shown in FIG. 4E. Measurement 404 may be taken of waveform D1 at time T15, then, measurement 406 may be taken of waveform D1 at time (T15 minus one fine delay period), measurement 408 may be taken of waveform D1 at time (T15 minus two fine delay periods), and so on, until measurement 418 is taken at time T10. The result of taking measurements (404-418) through the aforementioned alternate technique may be the same as those shown in Table 1, above. The resulting representative measurements (404-418) are also shown in FIG. 4E as a series of 0's and 1's between T10 and T15. The values of representative measurements (404-418) shown between T10 and T15 may be read from right to left, as shown by directional arrow 422, in order to be consistent with the top to bottom order of the measurements (404-418) as shown in Table 1. The convention used herein, however, will be to show the measurements taken at a particular time listed from left to right, beginning from the time the measurements are taken; as shown, for example, by the measurements listed in a measurement box 432 taken at time T15. The measurements (404-418), taken at time T15, may be listed in tabular form as shown in Table 2, below.

TABLE 2

| MEASUREMENT INDEX | PERIOD MEASURED | MEASURED VALUES |
| --- | --- | --- |
| 1 | P10 | 0 0 0 0 1 1 1 1 |

In one or more embodiments, measurements (404-418) may be taken by noise analyzer 120 at times subsequent to, and/or prior to, time period P10. In one or more embodiments, noise analyzer 120 may take multiple instances of measurements equivalent to measurements (404-418). If, for example, the equivalent measurements (404-418) were taken for time periods P5-P40 of the waveform shown in FIG. 4C, the results would be as shown in Table 3, below.

TABLE 3

(WAVEFORM of FIG. 4C)

| MEASUREMENT INDEX | MEASUREMENT TIME | MEASURED VALUES |
| --- | --- | --- |
| 1 | T5 | 0 0 0 0 1 1 1 1 |
| 2 | T10 | 1 1 1 1 0 0 0 0 |
| 3 | T15 | 0 0 0 0 1 1 1 1 |
| 4 | T20 | 1 1 1 1 0 0 0 0 |
| 5 | T25 | 0 0 0 0 1 1 1 1 |
| 6 | T30 | 1 1 1 1 0 0 0 0 |
| 7 | T35 | 0 0 0 0 1 1 1 1 |
| 8 | T40 | 1 1 1 1 0 0 0 0 |

The measurements shown in Table 3, above, may then, in one or more embodiments, represent measurements taken by noise analyzer 120 of a noise-free metasignal which was created based on, and may be indicative of, a noise-free initial signal. A value of 1 in Table 3 may represent a high value of the waveform of FIG. 4C and a value of 0 may represent a low value of the waveform of FIG. 4C. Though the measurement values shown above are ones and zeroes, representing measurements of a digital signal, the measurements may be taken of an analog signal (as shown in FIG. 2), in that case, the resulting measured values could differ from one and zero.

The aforementioned noise-free initial signal of FIG. 4A may be a square wave representing a noise-free clock signal, and the aforementioned metasignal of FIG. 4C may be a square wave generated from the initial signal and having a period equal to a multiple of the initial signal. Therefore, the measurements shown in Table 3 may represent measurements that would be taken by noise analyzer 120 for a noise-free situation. If, in another embodiment, noise analyzer 120 took measurements of a signal containing noise, such as signal and noise 110, the results would differ from those shown in Table 3, and resulting differences might then be used as a signature to identify particular types of noise, such as low frequency noise, high frequency noise, and/or the source of the noise.

FIG. 4F shows, according to one or more embodiments, an enlarged detail of series of fine delay elements 450 previously shown in FIG. 4C and FIG. 4D. In one embodiment, a signal may be delayed from an initial temporal location, T5, for example, by a base delay 202 and/or a series of fine delays 450, wherein the series of fine delays 450 may comprise fine delay 204 and additional fine delays 440. In one or more embodiments, base delay 202 may not be used, or the temporal displacement supplied by base delay 202 may vary from that shown in FIG. 4F, or more than one base delay 202 may be used. Though seven total fine delays (one fine delay 204 and six fine delays 440) are shown in FIG. 4E, any number of fine delay elements may be used by noise analyzer 120 in other embodiments. Though the series of fine delays 450 in FIG. 4F are represented as effecting equal time delays, the delays effected by series of fine delays 450 may differ from each other in other embodiments. In one embodiment, the. The delayed signal may propagate past a second temporal location, T10, for example, then, noise analyzer 120 may take measurements (404-418) at the same or a different temporal location and/or locations. In one embodiment, noise analyzer 120 may take measurements (404-418) of a signal or signals. In one example, noise analyzer 120 may take measurements (404-418) of a delayed signal, generated at time T5, at time T15. Though all measurements (404-418) may be taken at the same time (T15, for example, as previously shown in FIG. 4D), this may be equivalent to measuring the delayed signal at different temporal locations between two separate time periods. For example, the delayed metasignal mts of FIG. 4D may be delayed through base delay 202 and series of fine delays 450, and noise analyzer 120 may take measurements (404-418) at time T15 of each version of the delayed signal (D1-D8), or, the equivalent measurements (404-418) may be taken by noise analyzer 120 at time periods between T10 and T15, with each temporal division between measurement time periods being equivalent to one of the series of fine delays 450. An example of the aforementioned equivalent measurement method is shown in FIG. 4E and FIG. 4F, where measurements (404-418) may be taken of a single version of delayed metasignal mts (e.g. waveform D1 of FIG. 4D) at different time periods between T10 and T15, the temporal distance between measurements (404-418) corresponding to the series of fine delays 450. For example, measurement 404 may be taken by noise analyzer 120 at time T15, measurement 406 may be taken by noise analyzer 120 at time T15 minus fine delay 204, measurement 408 may be taken by noise analyzer 120 at time (T15 minus (fine delay 204 plus one fine delay 440), measurement 410 may be taken by noise analyzer 120 at time (T15 minus (fine delay 204 plus two fine delays 440), and so on, until measurement 418 could be taken by noise analyzer 120 at time (T15-(fine delay 204+six fine delays 404)). Thus, in one or more embodiments, equivalent measurements (404-418) may be taken by noise analyzer 120 at a single time (for example, T15) of a signal subjected to multiple delays, as shown in FIG. 4D; or, at different time periods of a singly delayed signal, as shown in FIGS. 4E and 4F.

In one or more embodiments, the aforementioned measurements (404-418), as shown in FIGS. 4D, 4E, and 4F, may be taken recursively by noise analyzer 120; for example, a similar set of measurements (404-418) may be taken at time T15 for time period P10, at a subsequent time T20 for a subsequent time period P15, and so on, indefinitely. In one embodiment, series of fine delays 450 may be further subdivided into a series of even finer delays. Though eight total measurement points (404-418) are shown in FIG. 4F, any number of measurement points may be used. The time delays created by series fine delay elements 450 between measurement points (404-418) may be equal to, or different from, each other. The time delays created by series of fine delay elements 450 may vary from one time period to another. Base delay 202 may also vary from one time period to another, or omitted, in other embodiments. The time delays created by series of fine delay elements 450 may be produced in a circuit through inverters, capacitors, inductors and/or a combination of these or other circuit elements; produced by software, hardware, or a combination thereof; produced as a result of a program operating on a recorded or transmitted signal; and/or produced as a result of a processor configured to create such delays.

FIG. 5A shows, according to one or more embodiments, a square wave. In one or more embodiments, the square wave of FIG. 5A may be a noise-free digital signal which in turn may represent a noise-free clock signal.

FIG. 5B shows, according to one or more embodiments, a square wave containing high frequency noise, which may represent a clock signal experiencing high frequency period jitter. High frequency period jitter of a clock signal may refer to a situation in which the period of a clock signal varies from its ideal value during one cycle, and then recovers to its ideal state in the subsequent cycle. FIG. 5B shows, according to one or more embodiments, a clock signal which is shorter than the ideal length during time period P15 by jitter 520. The clock signal may then recover to its ideal state during time period P20. FIG. 5B also shows, according to one or more embodiments, a clock signal which is longer than the ideal length during the latter part of time period P25 and the initial part of time period P30 by jitter 530. The clock signal may then recover to its ideal state at the end of time period P30.

FIG. 5C shows, according to one or more embodiments, a signal which may be generated by noise analyzer 120 based on the signal from FIG. 5B. In one or more embodiments, the signal of FIG. 5B may represent a clock signal. The new signal of FIG. 5C may be a square wave that has a high value for one period of a clock cycle of a clock signal represented by FIG. 5B, then a low value for the next period of the clock cycle of FIG. 5B, with the high and low values of the new signal of FIG. 5C alternating with the clock cycles shown in FIG. 5B. In one or more embodiments, the waveform of FIG. 5C may be a metasignal of the waveform of FIG. 5A, in that the waveform of FIG. 5C may be generated by noise analyzer 120 to contain information about the waveform of FIG. 5A.

FIG. 5D shows, according to one or more embodiments, the signal of FIG. 5C offset by base delay 202. In one or more embodiments, noise analyzer 120 may apply fine delay elements 450 during the time periods (P5-P40) in order to take measurements of the signal shown in FIG. 5D, the aforementioned measurements may be taken by noise analyzer 120 of the signal after it has been successively delayed by each of the fine delay elements 450. In one or more embodiments, the aforementioned measurements may be taken by noise analyzer 120 at one or more of the rising edges of the waveform shown in FIG. 5A.

In one or more embodiments, jitter of a clock signal, which may be represented by the waveform shown in FIG. 5B may have a dual effect, in that the jitter may both cause a portion of the metasignal of FIG. 5C to be shorter or longer than it would be if produced based on a jitter-free clock signal, and; the measurements taken by noise analyzer 120 may occur at a time later or earlier when triggered by a clock signal containing jitter than if triggered by a jitter-free clock signal. For example, jitter 520 may cause the high portion of the metasignal of FIG. 5C in period P15 to be shorter, by the time difference between times T18 and T20, than it would be if generated by a jitter-free signal (see, as a comparison, the waveform of FIG. 4B during time period P15). In addition, the presence of jitter 520 may cause noise analyzer 120 to take its measurements at time T18 instead of at time T20. In this example, noise analyzer 120 would take measurements of time period P18 instead of measurements of time period P20, and the portion of the metasignal of FIG. 5D that is measured would not propagate exactly to the half-way point H20. In this example, 6 bits are measured on one side of half-way point H20, and 2 bits are measured on the other side of half-way point H20, as opposed to measurements that would be taken of a jitter-free, noise-free signal (for example, that of FIG. 4C during time period P20, in which 4 bits are measured on one side of half-way point H20, and 4 bits are measured on the other side of half-way point H20).

In another example, the jitter 530 may cause a high portion of the metasignal of FIG. 5C in periods P25 and P30 to be longer, by the time difference between times T30 and T32, than it would be if generated by a jitter-free signal (see, as a comparison, the waveform of FIG. 4B during time periods P25 and P30). In addition, the presence of jitter 520 may cause noise analyzer 120 to take its measurements at time T32 instead of at time T30. In this example, noise analyzer 120 would take measurements of time period P32 instead of time period P30 and the portion of metasignal of FIG. 5D that is measured propagates past the half-way point H30. In this example, 6 bits are measured on one side of half-way point H30, and 2 bits are measured on the other side of half-way point H30, as opposed to measurements that would be taken of a jitter-free, noise-free signal (for example, that of FIG. 4C during time period P30, in which 4 bits are measured on one side of half-way point H30, and 4 bits are measured on the other side of half-way point H30). Thus, in one or more embodiments, the presence of clock jitter may affect both the value of a metasignal and the instant of time at which the metasignal is measured.

In one embodiment, fine delay elements 450 may be configured so that delays between measurements are equally temporally spaced from each other and so that the number of measurements taken during one ideal clock period equals the number of measurements taken in any other ideal clock period. In other embodiments, fine delay elements 450 may be configured so that the temporal spacing between measurements is variable. If, according to one or more embodiments, the fine delay elements 450 are configured so that the temporal spacing between each measurement is equal, and this configuration is applied to the signal of FIG. 5D, the resulting measurements would be as shown in the following Table 4, below.

preceding or subsequent sample time, may be a result that is unique to high frequency clock jitter, and may be a noise signature that noise analyzer 120 may use to identify high frequency clock jitter.

FIG. 5E shows, according to one or more embodiments, a series of waveforms illustrating how noise analyzer 120 may take measurements after a base delay 202 and a series of fine delays 450. In one or more embodiments, waveform D1 may be a version of the waveform from FIG. 5C after having been delayed by base delay 202. Waveform D2 may be a version of the waveform of FIG. 5C delayed by base delay 202 and one of the series of fine delays 450, D3 may be the waveform of FIG. 5C delayed by base delay 202 and two of the series of fine delays 450, and so on, until D8, as shown, may represent a version of the waveform of FIG. 5C delayed by base delay 202 and seven of the series of fine delays 450. According to one or more embodiments, noise analyzer 120 may take measurements of the delayed versions of the aforementioned waveform at one or more particular times. For example, noise analyzer 120 may take measurements (404-418) of all waveforms D1 D8 at time T18; and may then take equivalent measurements (404-418) at another time T32. The results of the aforementioned measurements (404-418) may be as shown in Table 4B, below.

TABLE 4A (WAVEFORM of FIG. 5D)

| MEASUREMENT INDEX | MEASUREMENT TIME | MEASURED VALUES |
| --- | --- | --- |
| 1 | T5  | 0 0 0 0 1 1 1 1 |
| 2 | T10 | 1 1 1 1 0 0 0 0 |
| 3 | T15 | 0 0 0 0 1 1 1 1 |
| 4 | T18 | 1 1 0 0 0 0 0 0 |
| 5 | T25 | 0 0 0 0 0 0 1 1 |
| 6 | T32 | 1 1 1 1 1 1 0 0 |
| 7 | T35 | 0 0 1 1 1 1 1 1 |
| 8 | T40 | 1 1 1 1 0 0 0 0 |

TABLE 4B

Measurements of waveforms in FIG. 5E at times T18 and T32

| Waveform | Measurement Reference Number | Time T18 | Time T32 |
| --- | --- | --- | --- |
| D1 | 404 | 1 | 1 |
| D2 | 406 | 1 | 1 |
| D3 | 408 | 0 | 1 |
| D4 | 410 | 0 | 1 |
| D5 | 412 | 0 | 1 |
| D6 | 414 | 0 | 1 |
| D7 | 416 | 0 | 0 |
| D8 | 418 | 0 | 0 |

It may be seen, according to one embodiment, that the measurements taken by noise analyzer 120 of the waveform in FIG. 5D differ from the measurements taken by noise analyzer 120 of the waveform of FIG. 4C at indices 4, 5, 6, and 7. In one embodiment, these differences may represent a noise signature which can be used by noise analyzer 120 to identify high frequency noise, which may be high frequency clock jitter. In one or more embodiments, the aforementioned dual effect of high frequency clock jitter which may result from a rising edge of a clock signal occurring earlier than an ideal time, may result in the corresponding portion of an associated metasignal being shorter than normal, and that portion of the metasignal being sampled at an earlier time than normal; will also result in the subsequent portion of the metasignal being longer, by an equivalent amount. The aforementioned dual effect of high frequency clock jitter may, in one or more embodiments, result in a mirror image effect of the sampled values, for example, the samples taken at T18, shown in Table 4A, above are 1 1 0 0 0 0 0 0, and the samples taken at subsequent time T25 are a mirror image of those values, that is, 0 0 0 0 0 0 1 1. In another example, the samples taken at T32, shown in Table 4A, above, are 1 1 1 1 1 1 0 0; and the samples taken at subsequent time T35 are a mirror image of those values, that is, 0 0 1 1 1 1 1 1. The aforementioned mirror image effect, of the measurements taken at one sample time being equal to the reverse of the measurements of an immediately Though table 4B above shows eight measurements (404-418) being taken of the waveforms of FIG. 5E at two times, T18 and T32; noise analyzer 120 may take any number of measurements at any number of times. The measurements (404-418) shown in Table 4B may also be represented in a horizontal row to the right of the measurement time in for the waveform of which measurements have been taken. For example, FIG. 5E shows, according to one or more embodiments, the values of measurements (404-418) of 1 1 0 0 0 0 0 0 to the right of time T18, and the values of measurements (404-418) of 1 1 1 1 1 1 0 0 to the right of time T32. A similar method of illustrating measurements taken at particular times may be used in other figures within this application which show waveforms, for example, FIG. 5D.

FIG. 6A shows, according to one or more embodiments, a square wave. In one or more embodiments, the square wave of FIG. 6A may be a noise-free digital signal which in turn may represent a noise-free clock signal.

FIG. 6B shows, according to one or more embodiments, a square wave which may represent a metasignal generated based on the waveform previously shown in FIG. 6A. In one or more embodiments, a square wave metasignal of FIG. 6B may be generated by noise analyzer 120 in such a manner that a wavelength of a portion of the metasignal of FIG. 6B may be a multiple of the wavelength of the waveform of FIG. 6A. In one example, the wavelength of the metasignal of FIG. 6B may be twice that of the initial signal in FIG. 6A.

FIG. 6C shows, according to one or more embodiments, a delayed version of the metasignal of FIG. 6B, the waveform of FIG. 6C may thus also be regarded as a metasignal. In one or more embodiments, each cycle of the metasignal of FIG. 6B may be delayed by a base delay 202, resulting in the offset waveform of FIG. 6C. In one or more embodiments, base delay 202 may be created by noise analyzer 120 through one or more logic circuits. In one or more embodiments, base delay 202 may be applied to metasignal of FIG. 6B at a rising edge of a clock signal, the clock signal being potentially represented by the waveform of FIG. 6A. In one or more embodiments, the aforementioned logic circuit may receive power from a power supply. In one or more embodiments, the power from the power supply may vary over time, and the variations may affect base delay 202 generated by the aforementioned logic circuit. For example, if the power supply sends less power than an ideal amount to logic circuit, the delay of a signal through the logic circuit may be greater than an ideal base delay 202, as shown by long base delay 605. In another example, the power supply may send more power than an ideal amount to the logic circuit, which may result in a delay less than an ideal base delay 202, as shown by short base delay 610. An exemplary noise pattern as shown in FIG. 6C, in which a power supply level deviates from an ideal level, causing a variation from an ideal base delay 202 during an initial time period, then; upon returning to an ideal power supply level, base delay 202 returns to its ideal level within the subsequent time period, may represent high frequency supply noise. In one or more embodiments, each cycle of a metasignal as shown in FIG. 6B may be delayed by a different base delay (202, 605, 610), with the result as shown in FIG. 6C.

FIG. 6D shows, according to one or more embodiments, the waveform from FIG. 6C in which the separately delayed cycles from FIG. 6B, which may be a result of high frequency power supply noise, are combined to create a single waveform of FIG. 6D. It may be seen that, according to one or more embodiments, power supply noise, which may be represented by the metasignals shown in FIGS. 6C and 6D, has a singular effect on measurements which may be taken by noise analyzer 120; in that the power supply noise only affects the duration of the high and low values of the metasignals of FIGS. 6C and 6D, as opposed to clock jitter noise, which may be represented by the metasignals in FIGS. 5B-5D, and has a dual effect, both on the duration of the high and low values of the metasignals of FIGS. 5B-5D, and on the time at which noise analyzer 120 may take measurements. FIG. 6D also shows, according to one or more embodiments, the values which may result from noise analyzer 120 taking measurements of the waveform of FIG. 6D. The aforementioned measurements may be taken by noise analyzer 120 in a similar manner as measurements (404-418), as shown in FIGS. 4D-4F. In the example shown, measurements of the waveform in FIG. 6D may be taken at a rising edge of the signal shown in FIG. 6A. The waveform of FIG. 6A may represent an ideal square wave generated, for example, by a digital clock signal. The resulting exemplary measurements of FIG. 6D, which may be taken in a manner similar to that illustrated in FIG. 5E may be shown in tabular format, as in Table 5, below.

TABLE 5

(WAVEFORM of FIG. 6D)

| MEASUREMENT INDEX | MEASUREMENT TIME | MEASURED VALUES |
| --- | --- | --- |
| 1 | T15 | 0 0 0 0 1 1 1 1 |
| 2 | T20 | 1 1 0 0 0 0 0 0 |
| 3 | T25 | 0 0 1 1 1 1 1 1 |
| 4 | T30 | 1 1 1 1 0 0 0 0 |
| 5 | T35 | 0 0 0 0 1 1 1 1 |
| 6 | T40 | 1 1 1 1 1 1 0 0 |
| 7 | T45 | 1 1 1 1 0 0 1 1 |
| 8 | T50 | 0 0 0 0 1 1 1 1 |

It may be seen that the measurements taken by noise analyzer 120 of the waveform in FIG. 6D differ from the measurements taken by noise analyzer 120 of the waveform of FIG. 4C at measurement indices 2, 3, 6 and 7. These differences may, in one or more embodiments, represent a noise signature which can be used by noise analyzer 120 to identify high frequency power supply noise.

FIG. 7A shows, according to one or more embodiments, a square wave. In one or more embodiments, the square wave of FIG. 7A may be a noise-free digital signal which in turn may represent a noise-free clock signal.

FIG. 7B shows, according to one or more embodiments, a square wave containing low frequency noise, which may represent a clock signal experiencing low frequency period jitter. Low frequency period jitter of a clock signal may refer to a situation in which the period of a clock signal varies from its ideal value during one cycle, and then does not recover to its ideal state in the subsequent cycle. FIG. 7B shows, according to one or more embodiments, a clock signal which is shorter than the ideal length during time period P15 by jitter 720. In one embodiment, the clock signal does not recover to its ideal state during time period P20 and the rising edge of the clock occurs earlier than the rising edge of an ideal clock by jitter 725. FIG. 7B also shows, according to one or more embodiments, a clock signal which has not recovered to its ideal state in time period P25. In one example, the rising edge of the clock signal of FIG. 7B during period P25 occurs earlier than that of the rising edge of the ideal clock signal of FIG. 7A by an amount of jitter 730. In one example, the clock signal of FIG. 7B then recovers to its ideal state at the end of time period P30.

FIG. 7C shows, according to one or more embodiments, a signal which may be generated by noise analyzer 120 based on the signal from FIG. 7B. In one example, the signal of FIG. 7B may represent a digital clock signal. The new signal of FIG. 7C may be a square wave that has a high value for one period of the clock cycle of FIG. 7B, then a low value for the next period of the clock cycle of FIG. 7B, with the high and low values of the new signal of FIG. 7C alternating with the clock cycles shown in FIG. 7B. The signal of FIG. 7C may be a metasignal, in that it may be generated to incorporate information about the signal of FIG. 7B.

FIG. 7D shows, according to one or more embodiments, the signal of FIG. 7C offset by base delay 202. Noise analyzer 120 may apply fine delay elements 450 during the time periods (P5-P40) in order to take measurements of the signal as shown in FIG. 7D, with the temporal spacing between the measurements corresponding to fine delay elements 450. In one embodiment, fine delay elements 450 may be configured so that delays between measurements are equally temporally spaced from each other and so that the number of measurements taken during one ideal clock period equals the number of measurements taken in any other ideal clock period. In other embodiments, fine delay elements 450 may be configured so that the temporal spacing between measurements is variable. If, according to one or more embodiments, the fine delay elements 450 are configured so that the temporal spacing between each measurement is equal, and this configuration is applied to the signal of FIG. 7D, the resulting measurements, which may be taken in a manner similar to that illustrated in FIG. 5E, would be as shown in table 6, below.

TABLE 6

(WAVEFORM of FIG. 7D)

| MEASUREMENT INDEX | MEASUREMENT TIME | MEASURED VALUES |
| --- | --- | --- |
| 1 | T5 | 0 0 0 0 1 1 1 1 |
| 2 | T10 | 1 1 1 1 0 0 0 0 |
| 3 | T15 | 0 0 0 0 1 1 1 1 |
| 4 | T18 | 1 1 1 0 0 0 0 0 |
| 5 | T22 | 0 0 0 1 1 1 1 1 |
| 6 | T28 | 1 1 1 1 1 0 0 0 |
| 7 | T35 | 0 0 0 0 0 1 1 1 |
| 8 | T40 | 1 1 1 1 0 0 0 0 |

It may be seen that the exemplary measurements taken by noise analyzer 120 of the waveform in FIG. 7D differ from the measurements taken by noise analyzer 120 of the waveform of FIG. 4C at measurement indices 4, 5, 6 and 7. In one or more embodiments, these differences may represent a noise signature which can be used by noise analyzer 120 to identify low frequency noise, which may be low frequency clock jitter. Though eight measurements are shown in Table 6 above, any number of measurements may be taken by noise analyzer 120. It may be further noted, according to one or more embodiments, that the differences in measurements between FIG. 7D and FIG. 4C are due to a dual effect which may result from low frequency clock jitter, similar to the dual effect which may result from high frequency clock jitter, as described in relation to FIGS. 5B-5D, above; in that clock jitter may affect both the values of the generated metasignal as shown in FIGS. 7B-7D, and the timing at which noise analyzer 120 may take measurements of the metasignal.

FIG. 8A shows, according to one or more embodiments, a square wave. In one or more embodiments, the square wave of FIG. 8A may be a noise-free digital signal which in turn may represent a noise-free clock signal.

FIG. 8B shows, according to one or more embodiments, a square wave which may represent a metasignal generated based on the waveform previously shown in FIG. 8A, in that the waveform of FIG. 8B may incorporate information regarding the waveform of FIG. 8A. In one or more embodiments, a square wave metasignal of FIG. 8B may be generated by noise analyzer 120 in such a manner that a wavelength of a portion of the metasignal of FIG. 8B may be a multiple of the wavelength of the waveform of FIG. 8A. In one example, the wavelength of the metasignal of FIG. 8B may be twice that of the initial signal in FIG. 8A.

FIG. 8C shows, according to one or more embodiments, a delayed version of the metasignal of FIG. 8B. In one or more embodiments, each cycle of the metasignal of FIG. 8B may be delayed by a base delay 202, resulting in the offset waveform of FIG. 8C. In one or more embodiments, base delay 202 may be created by noise analyzer 120 through one or more logic circuits. In one or more embodiments, base delay 202 may be applied to the metasignal of FIG. 8B at a rising edge of a clock signal, the clock signal being potentially represented by the waveform of FIG. 8A. In one or more embodiments, the aforementioned logic circuit may receive power from a power supply. In one or more embodiments, the power from the power supply may vary over time, and the variations may affect base delay 202 generated by the aforementioned logic circuit. For example, if power supply sends less power than an ideal amount to logic circuit, the delay of a signal through the logic circuit may be greater than an ideal base delay 202, as shown by long base delay 805. In another example, power supply may send more power than an ideal amount to the logic circuit, which may result in a delay less than an ideal base delay 202, as shown by short base delay 810. An exemplary noise pattern as shown in FIG. 8C, in which a power supply level may deviate from an ideal level, causing a variation from an ideal base delay 202 during an initial time period to long base delay 805, then; in a time period immediately following the initial time period, the power supply may fail to return to its ideal level, causing further deviation from ideal base delay 202, such as short base delay 810; may represent low frequency supply noise. Each cycle of a metasignal as shown in FIG. 8B may be delayed by a different base delay (202, 805, 810), with an exemplary result shown in FIG. 8C.

FIG. 8D shows according to one or more embodiments, the waveform from FIG. 8C in which the separately delayed cycles from FIG. 8B are combined to create a single waveform of FIG. 8D. FIG. 8D also shows, according to one or more embodiments, the values which may result from noise analyzer 120 taking measurements of the waveform of FIG. 8D. The aforementioned measurements may be taken in a similar manner as measurements (404-418), as shown in FIGS. 4D-4F. In the example shown, measurements of the waveform in FIG. 8D may be taken at a rising edge of the signal shown in FIG. 8A. The waveform of FIG. 8A may represent an ideal square wave generated, for example, by a digital clock signal. The resulting exemplary measurements of FIG. 8D, which may be taken in a manner similar to that illustrated in FIG. 5E, may be shown in tabular format, as in Table 7, below.

TABLE 7

(WAVEFORM of FIG. 8D)

| MEASUREMENT INDEX | MEASUREMENT TIME | MEASURED VALUES |
| --- | --- | --- |
| 1 | T15 | 0 0 0 0 1 1 1 1 |
| 2 | T20 | 1 1 1 1 0 0 0 0 |
| 3 | T25 | 0 0 0 0 1 1 1 1 |
| 4 | T30 | 1 1 0 0 0 0 0 0 |
| 5 | T35 | 0 0 1 1 1 1 1 1 |
| 6 | T40 | 1 1 1 1 1 1 0 0 |
| 7 | T45 | 1 1 1 1 0 0 1 1 |
| 8 | T50 | 0 0 0 0 1 1 1 1 |

It may be seen that the measurements taken by noise analyzer 120 of the waveform in FIG. 8D may differ from the measurements taken by noise analyzer 120 of the waveform of FIG. 4C at measurement indices 4, 5, 6 and 7. These differences, according to one or more embodiments, may represent a noise signature which can be used by noise analyzer 120 to identify low frequency power supply noise. Though eight measurements are shown in Table 7 above, any number of measurements may be taken by noise analyzer 120. It may be further noted, according to one or more embodiments, that the differences in measurements between FIG. 8D and FIG. 4C are due to a singular effect which may result from low frequency power supply noise, similar to the singular effect which may result from high frequency power supply noise, as described in relation to FIGS. 6B-6D, above; in that power supply noise may affect the values of the generated metasignal as shown in FIGS. 8B-8D, but not the timing at which noise analyzer 120 may take measurements of the metasignal.

A summary of measurements which may be taken by noise analyzer 120, according to one or more embodiments, is shown in Table 8, below. In one or more embodiments, the measurements from FIG. 4C may represent a noise-free signal. In one or more embodiments, the measurements from FIG. 5D may represent a signal containing high frequency clock noise, which may also be referred to as high frequency jitter. In one or more embodiments, the measurements from FIG. 6D may represent a signal containing high frequency power supply noise. In one or more embodiments, the measurements from FIG. 7D may represent a signal containing low frequency clock noise, which may also be referred to as low frequency jitter. In one or more embodiments, the measurements from FIG. 8D may represent a signal containing low frequency power supply noise. Though the measurements taken of the waveforms in FIGS. 4D, 5D, 6D, 7D, and 8D, as shown in Table 3, Table 4A, and Tables 5-7 above, may begin at different times (e.g. measurements in Table 6 begin at time T5, and measurements in Table 7 begin at time T15), each set of measurements begins at an equivalent noise-free time, as represented by the 0 0 0 0 1 1 1 1 series of measurements, and thus the comparisons of each set of measurement at the given measurement index numbers are valid. It may be noted, from examining Table 8, below, that each column of the measurements which may be taken by noise analyzer 120 from FIG. 5D, FIG. 6D, FIG. 7D, and FIG. 8D contain differences from what may be a noise-free signal of FIG. 4C, and from each of the other columns of measurements.

In one or more embodiments, the differences in measurements shown in Table 8, below, may represent noise signatures which may be used by and/or created by noise analyzer 120 to determine the frequency and/or the source of noise within a signal. Though eight measurement indices are shown in Table 8, noise analyzer 120 may use any number of measurement indices, and may take any number of measurements.

TABLE 8

| MEASURE-MENT INDEX | FIG. 4C (Noise Free) | FIG. 5D | FIG. 6D | FIG. 7D | FIG. 8D |
|---|---|---|---|---|---|
| 1 | 0000 1111 | 0000 1111 | 0000 1111 | 0000 1111 | 0000 1111 |
| 2 | 1111 0000 | 1111 0000 | 1100 0000 | 1111 0000 | 1111 0000 |
| 3 | 0000 1111 | 0000 1111 | 0011 1111 | 0000 1111 | 0000 1111 |
| 4 | 1111 0000 | 1100 0000 | 1111 0000 | 1110 0000 | 1100 0000 |
| 5 | 0000 1111 | 0000 0011 | 0000 1111 | 0001 1111 | 0011 1111 |
| 6 | 1111 0000 | 1111 1100 | 1111 1100 | 1111 0000 | 1111 1100 |
| 7 | 0000 1111 | 0011 1111 | 1111 0011 | 0000 1111 | 1111 0011 |
| 8 | 1111 0000 | 1111 0000 | 0000 1111 | 1111 0000 | 0000 1111 |

In some embodiments, it may be possible for the measurements taken by noise analyzer 120 of low-frequency clock noise, as represented by the FIG. 7D column in Table 8, above, to have the same signature as measurements taken by noise analyzer 120 of low-frequency power supply noise, as represented by the FIG. 8D column, in Table 8, above. In those embodiments, noise analyzer 120 may switch between one power supply and a second power supply in order to determine the source of the noise. In one embodiment, if the noise signature measured by noise analyzer 120 is due to low frequency clock noise, then the noise signature will not differ if the noise analyzer 120 switches between one power supply and a second power supply. However, in one embodiment, if the noise signature measured by noise analyzer 120 is due to low frequency power supply noise, then the noise signature will vary if noise analyzer switches between one power supply and a second power supply.

Figure 9:
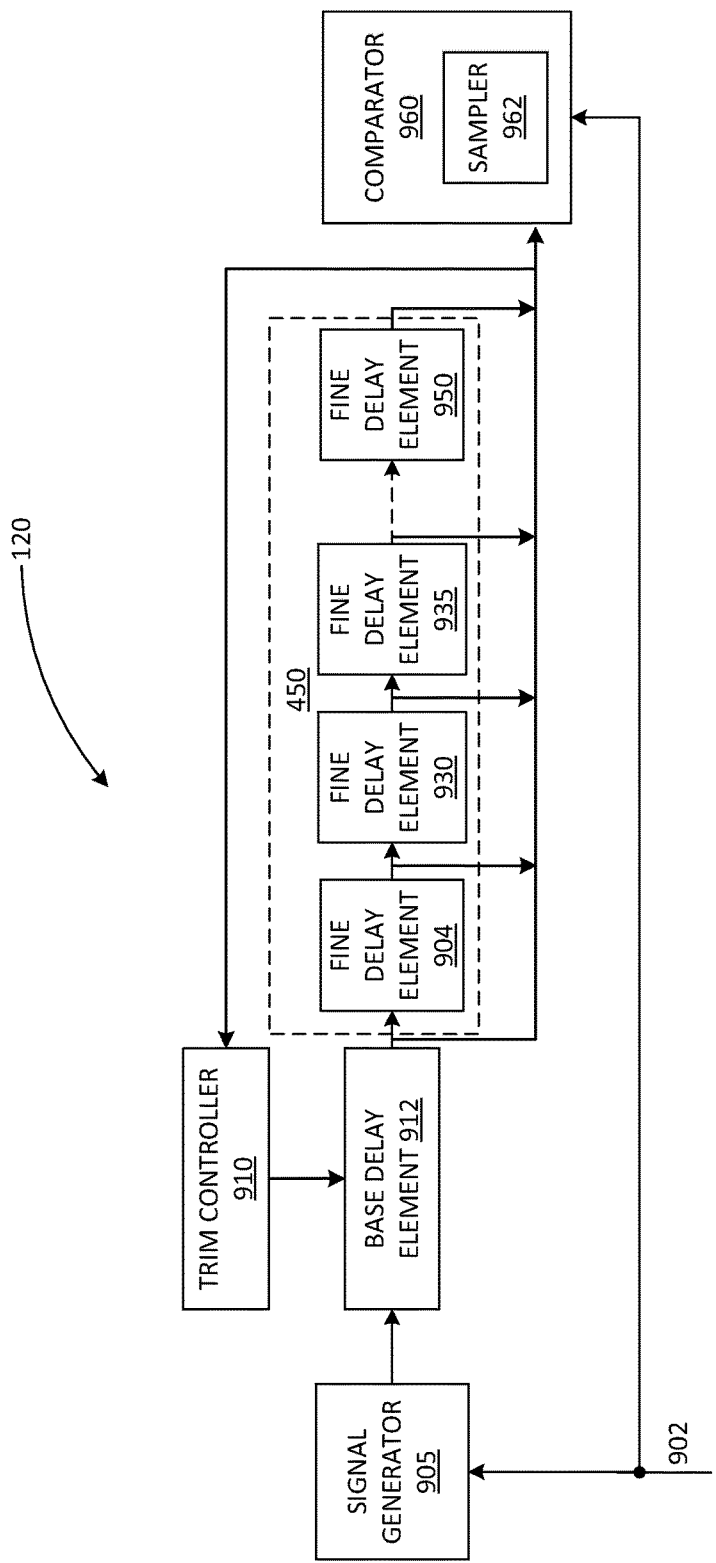
FIG. 9 is a block diagram of a noise analyzer, according to one or more embodiments.

FIG. 9 shows, according to one or more embodiments, a block diagram of noise analyzer 120. In one or more embodiments, an input signal 902 may be received by a signal generator 905. Signal generator 905 may create a new signal based on input signal 902, and the new signal may be a metasignal, in that it may incorporate information regarding input signal 902. In one embodiment, signal generator 905 may create a new signal based on input signal 902 by doubling the period of input signal 902. In other embodiments, signal generator 902 may create a new signal based on input signal 902 by performing any mathematical operation on input signal 902. The new signal from signal generator 905 may then pass into a base delay element 912. Base delay element 912 may delay the signal from signal generator 905, effectively phase-shifting, or temporally displacing, the signal from signal generator 905. In one or more embodiments, the amount of delay, or temporal displacement, induced by base delay element 912 may correspond to the previously mentioned base delay 202. In one or more embodiments, the delay induced by base delay element 912 may be variable. In one or more embodiments, base delay element 912 may be omitted. Output from base delay element 912 may then be fed into a series of fine delay elements 450 and into a comparator 960. Series of fine delay elements 450 may be comprised of one or more fine delay elements. Each of the fine delay elements in series of fine delay elements 450 may be independently controlled. In one or more embodiments, the delay induced by each of the series of fine delay elements 450 may be variable, and/or may be different for each delay in the series of fine delay elements. In one or more embodiments, the number of series of fine delay elements 450 used may be zero. Series of fine delay elements 450 may be created through one or more inverters, capacitors, inductors and/or a combination of other circuit elements; produced by software, hardware, or a combination thereof; produced as a result of a program operating on a recorded or transmitted signal; and/or produced as a result of a processor configured to create such delays.

FIG. 9 also shows, according to one or more embodiments, the output from base delay element 912 entering fine delay element 904. In one or more embodiments, fine delay element 904 induces a fine delay, or fine temporal displacement, in the output received from base delay element 912. In one or more embodiments, the amount of delay, or temporal displacement, induced by fine delay element 904 may correspond to previously mentioned fine delay 204. Output from fine delay element 904 may then be split and sent to both a fine delay element 930 and the comparator 960. Fine delay element 930 may induce an additional delay, or temporal displacement, in the output received from fine delay element 904. Output from fine delay element 930 may then be split and sent to both a fine delay element 935 and the comparator 960. Fine delay element 935 may then induce an additional delay in the output received from fine delay element 930. The output from fine delay element 935 may then be split and sent to both additional fine delay elements and comparator 960. There may be any number of fine delay elements between fine delay element 935 and a fine delay element 950, with each fine delay element receiving input from the previous fine delay element, and sending output to the subsequent fine delay element and the comparator 960. Fine delay element 950 may receive input from the second-to-last fine delay element in series of fine delay elements, induce an additional delay, and then sent to comparator 960. Comparator 960 may receive a non-delayed input signal 902, the output from base delay element 912, and the output from fine delay elements 450. In one or more embodiments, input signal 902 may be a square wave indicating a digital clock signal. Comparator 960 may take measurements of the output from base delay element 912, fine delay elements 450 and/or input signal 902, and/or perform other operations on the output from fine delay elements 450 and/or input signal 902. Comparator 960 may be configured to determine unique characteristics indicative of particular types of noise that may be present in or combined with input signal 902, with such characteristics constituting a signature which may then be used to identify particular types of noise. In another embodiment, the input to and/or the output from the series of fine delay elements 450 and/or the base delay element 912 may be sampled by an n-bit synchronizer with the resulting samples then being received by comparator 960. In one or more embodiments, comparator 960 may comprise a sampler 962. Sampler 962 may take samples, or measurements of the input signal, metasignals, and or outputs of the fine delays 450 and/or the base delay element 912. In one or more embodiments, sampler 962 may be an n-bit synchronizer. In one or more embodiments, comparator 960 may perform operations on the aforementioned samples received from an n-bit synchronizer in accordance with other examples and embodiments herein described. Comparator 960 may be configured to identify noise such as high frequency noise, low frequency noise, clock jitter, power supply noise, and/or other types of noise. In one or more embodiments, comparator 960, base delay element 912, and series of fine delays 450 may be configured to perform delays, generate metasignals, and take and compare measurements consistent with methods, devices, and systems as previously described in relation to FIGS. 4A-8D. In one embodiment, output from base delay 202 and series of fine delay elements 450 may be fed back into a trim controller 910. The trim controller 910 may dynamically alter the amount of base delay 202 induced by base delay element 912. In one or more embodiments, trim controller 910 may alter the amount of base delay 202 induced by base delay element 912 in order to compensate for any type of high frequency noise, and/or low frequency noise previously described. For example, in a situation where low frequency noise is present, similar to the situation as shown in FIG. 8C, trim controller 910 may alter long base delay 805 and/or short base delay 810 so that they are returned to delay values equal to base delay 202.

Figure 10:
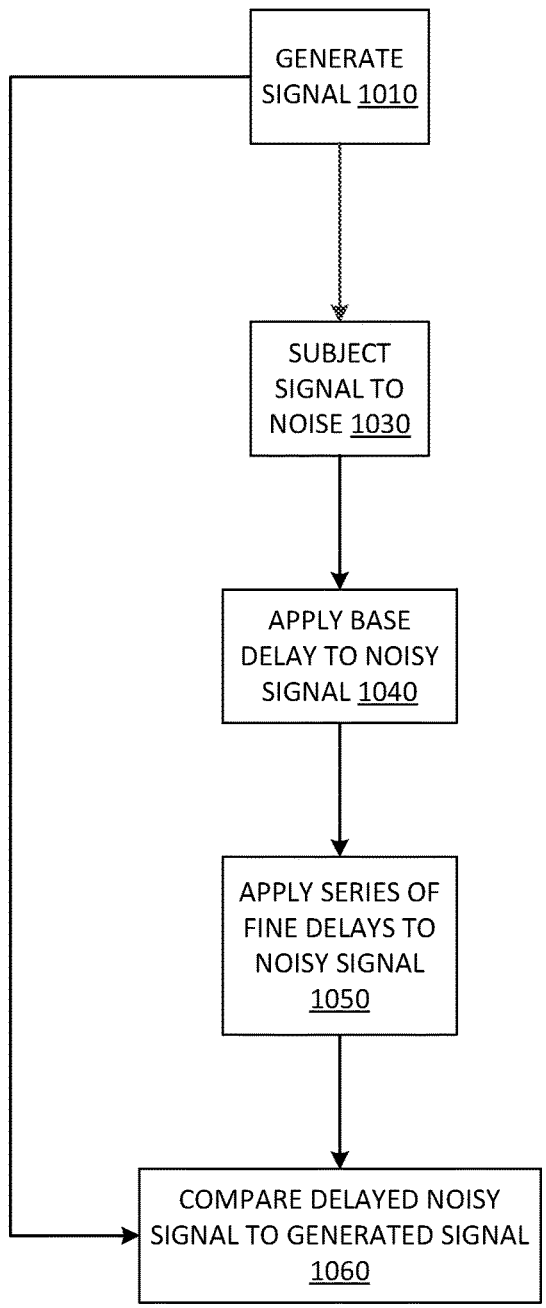
FIG. 10 is a flowchart showing a procedure that may be used by a noise analyzer, according to one or more embodiments.

FIG. 10 is a flowchart showing an example embodiment of a method for analyzing noise. The flowchart includes operations 1010-1060, which are arranged in an exemplary embodiment. Other embodiments may execute two or more operations in parallel. The exemplary process is applicable to software, firmware, and/or hardware implementations.

Operation 1010 may generate a signal. The generated signal may be analog or digital, and may be generated independently of any external signal and/or generated based on a signal received from an external source. Operation 1030 may apply noise to the signal generated by operation 1010. The noise may be high frequency noise, low frequency noise, or a combination thereof. The aforementioned mentioned noise may be added inadvertently and/or intentionally in operation 1030. Operation 1040 may apply a base delay to the output of operation 1030. The amount of delay applied by operation 1040 may be zero or any greater amount of delay. Operation 1050 may apply a series of fine delays to the output from operation 1040. The number of fine delays applied in operation 1050 may be zero, or any greater number of delays. The timing of the fine delays applied in operation 1050 may be equal to, or different from, each other. Operation 1060 may receive the delayed output from operation 1050 and the original signal generated in operation 1010. Operation 1060 may apply a series of comparisons, measurements, or operations on the output received from operations 1050 and 1010 in order to detect and analyze noise signatures which may identify the type of noise added in operation 1030.

Figure 11:
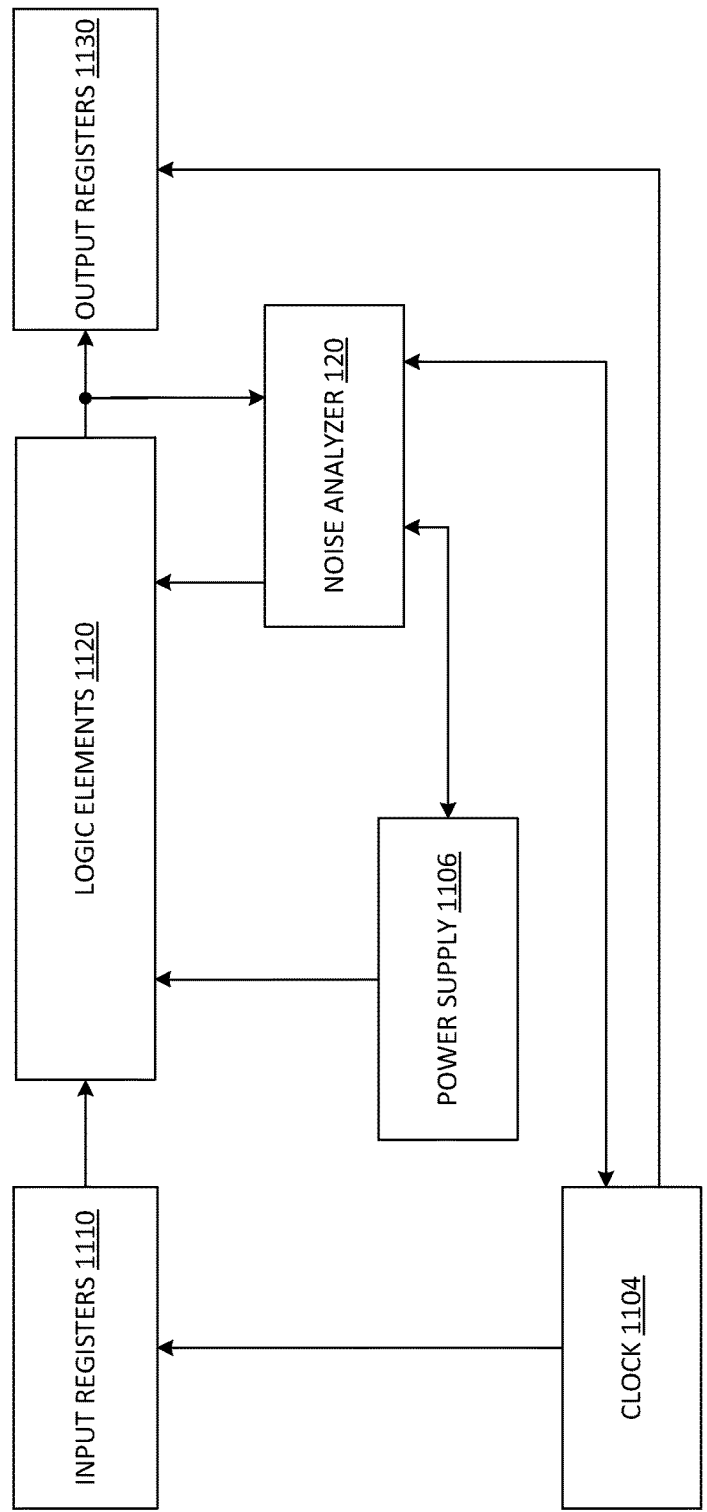
FIG. 11 is a block diagram illustrating a noise analyzer connected to clocked logic elements, according to one or more embodiments.

FIG. 11 shows, according to one or more embodiments, a data processor which may incorporate noise analyzer 120. In one or more embodiments, a clock 1104 may generate a signal which controls operation of a group of input registers 1110 and a group of output registers 1130. In one example, input registers 1110 and output registers 1130 may comprise memory elements configured to store digital data. In one or more embodiments, input registers 1110 may be configured to accept data from an outside source and/or input data into a set of the logic elements 1120, with aforementioned input/output operations occurring based on a signal from clock 1104. In one or more embodiments, output registers 1130 may be configured to accept data from logic elements 1120 and/or output data to an outside destination, with aforementioned input/output operations occurring based on a signal from clock 1104. In one or more embodiments, the signal generated by clock 1104 may be a square wave similar to the waveform previously shown in FIG. 4A. In one or more embodiments, clock 1104 may generate a square wave, and input registers 1110 may be configured to input or output data at a rising or falling edge of the aforementioned square wave. In one or more embodiments, clock 1104 may generate a square wave, and output registers 1130 may be configured to input or output data at a rising or falling edge of the aforementioned square wave. In one or more embodiments, input and/or output of input registers 1110 may be configured to occur at an initial cycle in the signal produced by clock 1104, and input and/or output of output registers 1130 may be configured to occur at a cycle subsequent to the initial cycle. Input registers 1110 and/or output registers 1130 may input and/or output data repeatedly, with the input and/or output being controlled by recurring signals generated from clock 1104. In one or more embodiments, variations in the signal produced by clock 1104 may affect the timing of input and/or output of input registers 1110 and/or output registers 1130.

FIG. 11 also shows, according to one or more embodiments, a power supply 1106 connected to logic elements 1120. Logic elements 1120 may be configured to receive data from input registers 1110, process the data received, and output the results of the data processing to output registers 1130. The power supply 1106 may supply power, electrical or otherwise, to logic elements 1120, with the power supplied being required by logic elements 1120 in order to process the data received. In one or more embodiments, the amount of power supplied by the power supply 1106 to logic elements 1120 may affect the data processing speed of logic elements 1120. For example, power supply 1106 may supply a theoretically ideal power level to logic elements 1120, which may allow logic elements 1120 to process data at an ideal rate. When supplied with the aforementioned theoretically ideal power level, logic elements 1120 may, in one or more embodiments, be configured to complete a set of data processing operations during one instant of time when clock 1104 may send a signal to input registers 1110 to input data into logic elements 1120, and a subsequent instant in time when clock 1104 may send a signal to output registers 1130 to receive data from logic elements 1120. In one example, when power supplied to logic elements 1120 by power supply 1106 is greater than a theoretically ideal level, the logic elements 1120 may perform the aforementioned data processing operations at a faster rate than the ideal rate. In another example, when power supplied to logic elements 1120 by power supply 1106 is less than a theoretically ideal level, the logic elements 1120 may perform the aforementioned data processing operations at a slower rate than the ideal rate. If, in either example, logic elements 1120 perform at a rate either faster than or slower than an ideal rate, errors in data output to output registers 1130 may occur, and/or the entire data processor of FIG. 11 may function more slowly than it would under ideal conditions.

FIG. 11 further shows, according to one or more embodiments, a noise analyzer 120 which may be configured to receive a signal from clock 1104, power supply 1106, and/or logic elements 1120. In one embodiment, noise analyzer 120 may generate a second signal based on a first signal received from clock 1104, power supply 1106, and/or logic elements 1120. The aforementioned second signal generated by noise analyzer 120 may be a metasignal of the first signal received, for example, the second generated signal may be generated so that it encodes information about the first signal. In one or more embodiments, noise analyzer 120 may generate more than one metasignal. In one embodiment, the first signal received by noise analyzer 120 may be a square wave which may indicate a digital signal. In one embodiment, the second signal, i.e., the metasignal, generated by noise analyzer 120 may have a period that is a multiple of the period of the first signal received by noise analyzer 120. Noise analyzer 120 may further apply a temporal delay or delays to the metasignal and/or the first signal received by noise analyzer 120 from clock 1104, power supply 1106, and/or logic elements 1120. In one or more embodiments, noise analyzer 120 may perform measurements on the aforementioned metasignal and/or delayed metasignal; and compare the measurements taken to measurements that would occur if the metasignal were generated by a theoretically ideal signal from clock 1104, power supply 1106, and/or logic elements 1120.

In one or more embodiments, noise analyzer 120 may analyze the aforementioned measurements in comparison with theoretically ideal measurements in order to determine if first signal received by noise analyzer 120 and/or metasignal generated by noise analyzer 120 contains noise, or is free from noise. In one embodiment, if noise analyzer 120 determines that noise is present, it may further analyze that noise to determine if the noise may be high frequency noise and/or low frequency noise. In one or more embodiment, noise analyzer 120 may examine the metasignal and measurements gathered from the metasignal to detect noise signatures which may determine if the source of noise may be clock 1104 and/or power supply 1106. In one embodiment, the signatures may be in a format as previously discussed in relation to FIGS. 4A-8D above.

If, in one or more embodiments, noise analyzer 120 detects high and/or low frequency noise having as its source clock 1104 and/or power supply 1106; noise analyzer 120 may then feedback a signal to clock 1104, power supply 1106 and/or logic elements 1120 to correct or compensate for detected noise. For example, if noise analyzer 120 determines noise having clock 1104 as a source is present, noise analyzer 120 may send a signal to reset clock 1104. If, in another example, noise analyzer 120 determines that noise having power supply 1106 as a source is present, noise analyzer 120 may send a signal to power supply 1106 to either increase or decrease supply voltage from power supply 1106. Alternatively, in another example, if noise analyzer 120 determines that any source of noise may be causing logic elements 1120 to complete processing of data too quickly to be accepted by output registers 1130 without error, noise analyzer 120 may send a signal to logic elements 1120 to delay output to output registers 1130 by an appropriate amount of time.

Figure 12:
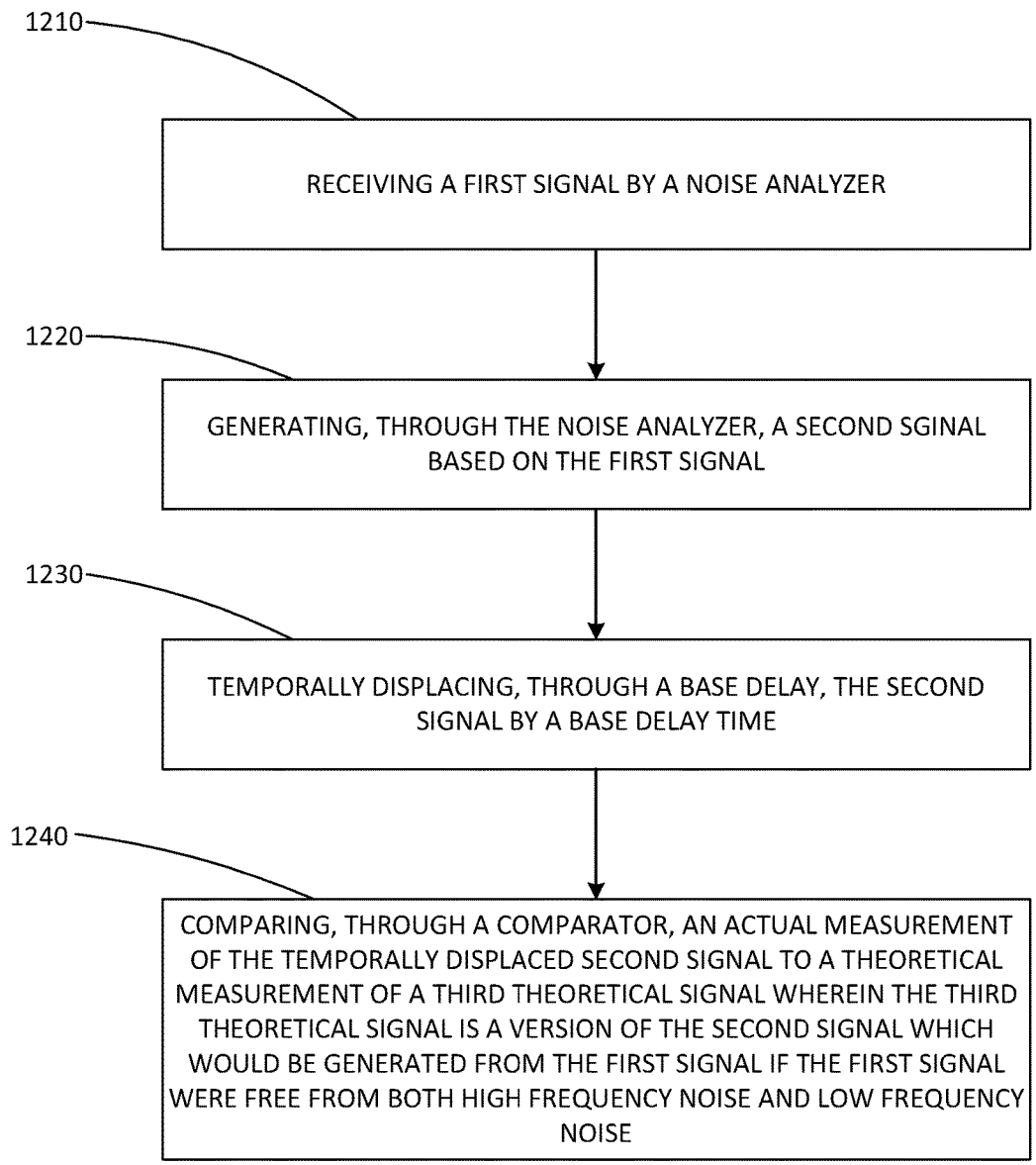
FIG. 12 is a process flow diagram of a noise analyzer, according to one or more embodiments.

FIG. 12 shows, according to one or more embodiments, a process flow diagram detailing the operations of a noise analysis process. In one or more embodiments, operation 1210 may involve noise analyzer 120 receiving a first signal. In one or more embodiments, operation 1220 may involve generating, through the noise analyzer, a second signal based on the first signal. In one or more embodiments, operation 1230 may involve temporally displacing, through a base delay, the second signal by a base delay time. In one or more embodiments, operation 1240 may involve comparing, through a comparator, an actual measurement of the temporally displaced second signal to a theoretical measurement of a third theoretical signal wherein the third theoretical signal is a version of the second signal which would be generated from the first signal if the first signal were free from both high frequency noise and low frequency noise.

Although the present embodiments have been described with reference to specific example embodiments, it will be evident that various modifications and changes may be made to these embodiments without departing from the broader spirit and scope of the various embodiments. For example, the various devices and modules described herein may be enabled and operated through hardware circuitry (e.g., CMOS based logic circuitry), firmware, software or any combination of hardware, firmware, and software (e.g., embodied in a non-transitory machine-readable medium). For example, the various electrical structure and methods may be embodied through transistors, logic gates, and electrical circuits (e.g., application specific integrated (ASIC) circuitry and/or Digital Signal Processor (DSP) circuitry).

In addition, it will be appreciated that the various operations, processes and methods disclosed herein may be embodied in a non-transitory machine-readable medium and/or a machine-accessible medium compatible with a data processing system (e.g., a computer system), and/or may be performed in any order. Accordingly, the specification and drawings are to be regarded in an illustrative rather than a restrictive sense.

A number of embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

The structures and modules in the figures may be shown as distinct and communicating with only a few specific structures and not others. The structures may be merged with each other, may perform overlapping functions, and may communicate with other structures not shown to be connected in the figures. Accordingly, the specification and/or drawings may be regarded in an illustrative rather than a restrictive sense.

What is claimed is:

1. A method comprising:
receiving a first signal by a noise analyzer;
generating, through the noise analyzer, a second signal based on the first signal;
temporally displacing, through a base delay element, the second signal by a base delay time to produce a third signal;
temporally displacing the third signal within a period of the first signal, through a plurality of fine delay circuits coupled in series with the base delay element, to produce delayed versions of the third signal;
measuring the delayed versions of the third signal using the first signal to produce measured values of the delayed versions of the third signal for each period of the first signal;
determining one or more unique noise characteristics by comparing, through a comparator, each one of the measured values to respective measurements of an ideal signal, wherein the ideal signal is a version of the third signal which would be generated from the first signal if the first signal were free from both high frequency noise and low frequency noise; and
creating a noise signature, based on the one or more unique noise characteristics.

2. The method of claim 1, wherein the first signal is a periodic signal, the second signal is a second periodic signal, and the second signal has a period that is a multiple of the period of the first signal.

3. The method of claim 1, wherein the first signal comprises a periodic square wave of a digital clock signal and the second signal comprises a square wave generated by the noise analyzer, with the second signal having a period being a multiple of the period of the first periodic square wave signal.

4. The method of claim 3, wherein the base delay time is equal to the period of the first signal.

5. The method of claim 1, further comprising identifying a noise type as clock jitter based on the noise signature.

6. The method of claim 1, further comprising identifying a noise type as power supply noise based on the noise signature.

7. The method of claim 1, further comprising:
switching from a first power supply to a second power supply;
creating a second noise signature; and
determining that a noise type is low frequency clock noise when the first noise signature equals the second noise signature or determining that the noise type is low frequency power supply noise.

8. The method of claim 1, wherein the delayed versions of the third signal are measured simultaneously.

9. The method of claim 1, wherein the base delay time changes for one or more periods of the first signal.

10. The method of claim 1, further comprising adjusting at least one of the base delay time and a fine delay of the fine delay circuits to propagate the second signal in a first period of the first signal to half-way through a subsequent period of the first signal.

11. The method of claim 1, further comprising creating an additional noise signature by comparing each one of the measured values for the period of the first signal to respective measured values for an immediately preceding or subsequent period of the first signal.

12. The method of claim 1, wherein, for each period of the first signal, the second signal is either a low value or a high value.

13. A noise analyzer system comprising: a
signal generator configured to receive a first signal and generate a second signal based on the first signal;
a base delay element configured to temporally displace the second signal by a base delay time to produce a third signal;
a plurality of fine delay circuits coupled in series with the base delay element and configured to temporally displace the third signal within a period of the first signal to produce at least one delayed version of the third signal;
a sampler configured to measure the delayed versions of the third signal using the first signal to produce measured values of the delayed versions of the third signal for each period of the first signal; and
a comparator configured to determine one or more unique noise characteristics by comparing each one of the measured values to respective measurements of an ideal signal, wherein the ideal signal is a version of the third signal which would be generated from the first signal if the first signal were free from both high frequency noise and low frequency noise, and create a noise signature, based on the one or more unique noise characteristics.

14. The system of claim 13, wherein the first signal is a periodic signal, the second signal is a second periodic signal, and the second signal has a period that is a multiple of the period of the first signal.

15. The system of claim 13, wherein the first signal comprises a periodic square wave of a digital clock signal and the second signal comprises a square wave generated by the signal generator, with the second signal having a period being a multiple of the period of the first periodic square wave signal.

16. A noise analyzer comprising:
a signal generator configured to receive a first signal and generate a second signal based on the first signal, a base delay element configured to temporally displace the second signal by a base delay time to produce a third signal;
a plurality of fine delay circuits coupled in series with the base delay element and configured to temporally displace the third signal within a period of the first signal to produce delayed versions of the third signal;
a sampler configured to measure the delayed versions of the third signal using the first signal to produce measured values of the delayed versions of the third signal for each period of the first signal; and
a comparator configured to determine one or more unique noise characteristics by comparing each one of the measured values to respective measurements of an ideal signal, wherein the ideal signal is a version of the third signal which would be generated from the first signal if the first signal were free from both high frequency noise and low frequency noise, and create a noise signature, based on the one or more unique noise characteristics.

17. The noise analyzer of claim 16, wherein the first signal is a periodic signal, the second signal is a second periodic signal, and the second signal has a period that is a multiple of the period of the first signal.

18. The noise analyzer of claim 17, wherein the first signal comprises a periodic square wave of a digital clock signal and the second signal comprises a square wave generated by the signal generator, with the second signal having a period being a multiple of the period of the first periodic square wave signal.

19. The noise analyzer of claim 16, wherein the base delay time changes for one or more periods of the first signal.

20. The noise analyzer of claim 16, wherein the base delay element is further configured further to adjust at least one of the base delay time and a fine delay of the fine delay elements to propagate the second signal in a first period of the first signal to half-way through a subsequent period of the first signal.

* * * * *